United States Patent
Kunihiro

(10) Patent No.: US 7,362,171 B2
(45) Date of Patent: Apr. 22, 2008

(54) HIGH-FREQUENCY AMPLIFIER

(75) Inventor: Kazuaki Kunihiro, Tokyo (JP)

(73) Assignee: NEC Corporation, Tokyo (JP)

( * ) Notice: Subject to any disclaimer, the term of this patent is extended or adjusted under 35 U.S.C. 154(b) by 156 days.

(21) Appl. No.: 10/579,040

(22) PCT Filed: Nov. 12, 2004

(86) PCT No.: PCT/JP2004/016864

§ 371 (c)(1),
(2), (4) Date: May 10, 2006

(87) PCT Pub. No.: WO2005/048448

PCT Pub. Date: May 26, 2005

(65) Prior Publication Data

US 2007/0063766 A1 Mar. 22, 2007

(30) Foreign Application Priority Data

Nov. 13, 2003 (JP) .............................. 2003-383209
Jun. 2, 2004 (JP) .............................. 2004-164831

(51) Int. Cl.
*H03F 3/68* (2006.01)

(52) U.S. Cl. .................... 330/126; 330/53; 330/124 R; 330/302

(58) Field of Classification Search ................ 330/126, 330/53, 124 R, 302
See application file for complete search history.

(56) References Cited

U.S. PATENT DOCUMENTS

| | | | | |
|---|---|---|---|---|
| 5,774,017 A | * | 6/1998 | Adar | 330/51 |
| 6,236,274 B1 | * | 5/2001 | Liu | 330/302 |
| 6,298,244 B1 | * | 10/2001 | Boesch et al. | 455/553.1 |
| 6,317,608 B1 | * | 11/2001 | Glocker | 455/553.1 |
| 6,466,768 B1 | * | 10/2002 | Agahi-Kesheh et al. | 455/78 |
| 7,116,175 B2 | * | 10/2006 | Shimizu et al. | 330/307 |

* cited by examiner

*Primary Examiner*—Patricia Nguyen
(74) *Attorney, Agent, or Firm*—Foley & Lardner LLP

(57) ABSTRACT

It is an object of this invention to provide a high-frequency amplifier which can efficiently amplify an input signal in a plurality of different frequency bands in a simple configuration. The high-frequency amplifier is configured such that an RF signal having n frequencies (f1>f2 . . . >fn) applied to the amplifier is converted by an impedance conversion circuit to a higher impedance than the output impedance of the amplifier, and is branched into the highest frequency f1 and lower frequencies lower than that by a high-pass filter and a low-pass filter. Frequency f1 passes high-pass filter 31, and is thereby converted to 50 ohms. The frequencies lower than frequency f1 filtered by the low-pass filter are converted to a high impedance by an impedance conversion circuit, and are branched into the second highest frequency f2 and lower frequencies by high-pass filter 32 and low-pass filter 42. In the same manner, impedance conversion circuits are added, while the signals are branched up to fn, to match the impedance to 50 ohms for each of the frequencies.

71 Claims, 22 Drawing Sheets

Fig.11
(a)
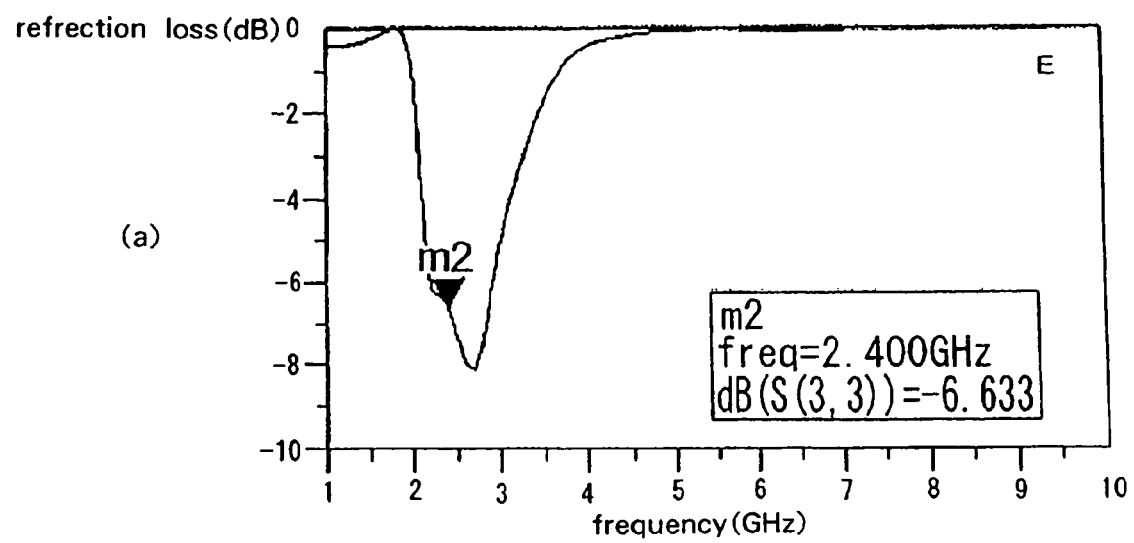
(b)
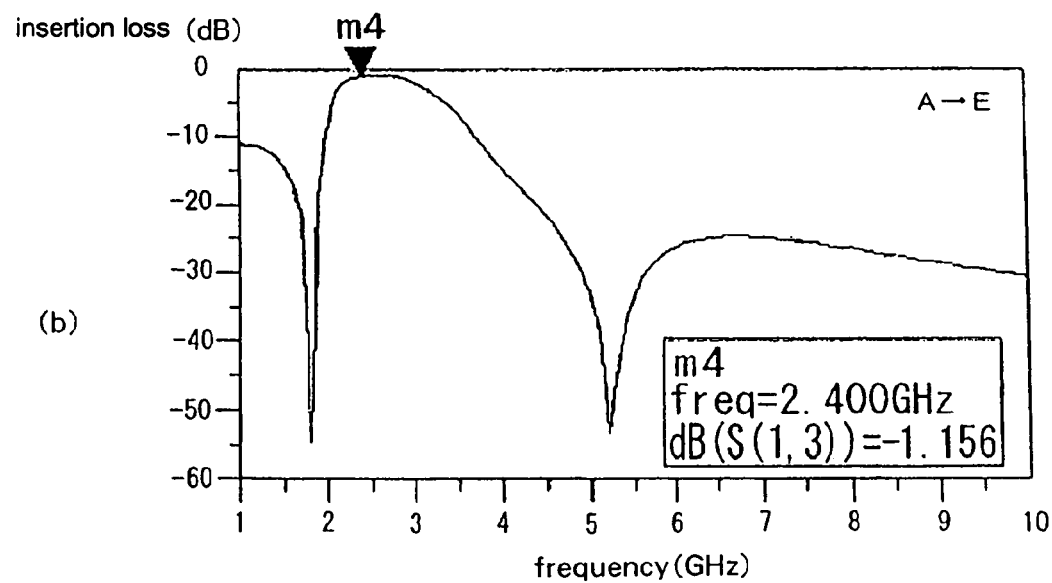

Fig.12
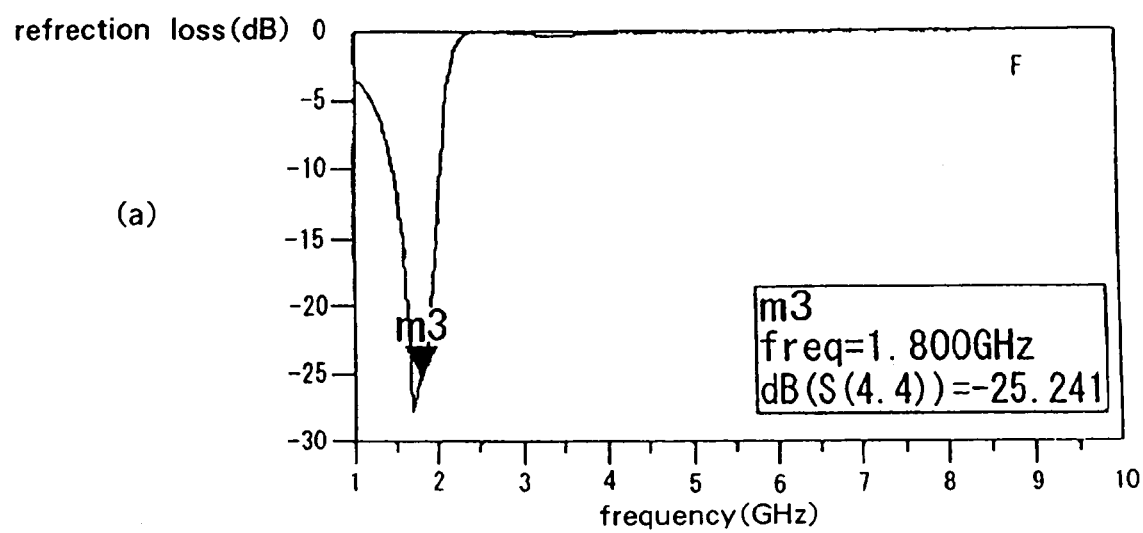
(a)
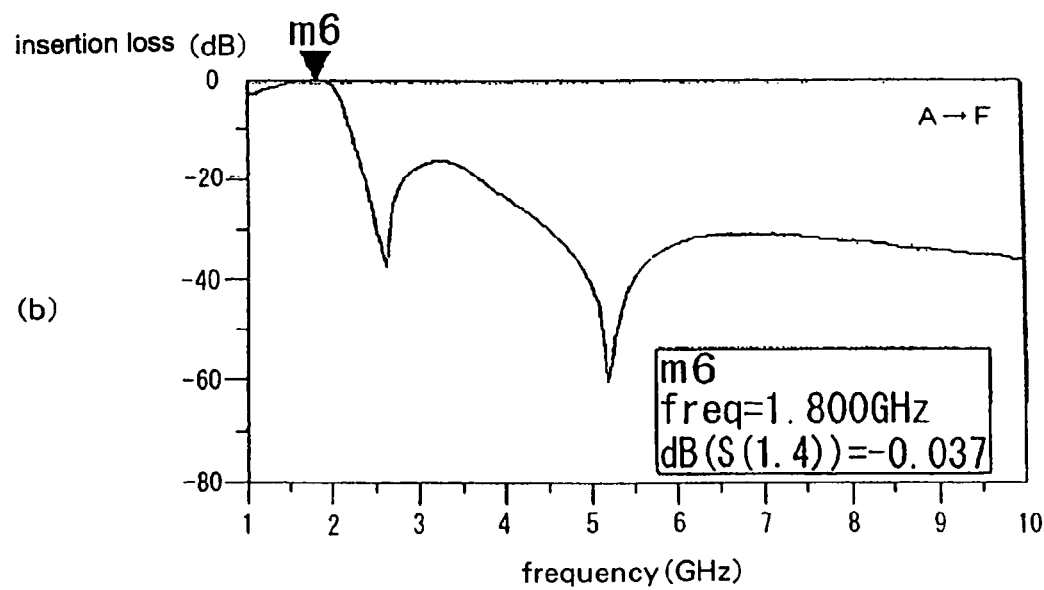
(b)

HIGH-FREQUENCY AMPLIFIER

TECHNICAL FIELD

The present invention relates to a high-frequency amplifier, and more particularly, to a high-frequency amplifier which can amplify an input signal in a plurality of different frequency bands.

BACKGROUND ART

In recent years, a need exists for handling RF signals in a plurality of frequency bands with a single terminal in a portable telephone and a wireless local area network (LAN) system. Conventionally, as a high-frequency (RF) amplifier for use in such an application, amplifiers 11, 12, ..., 1n and impedance conversion circuits 21, 22, ..., 2n have been generally provided in parallel one by one exclusively for each of respective frequency bands f1, f2, ..., fn having RF signals, for example, as illustrated in FIG. 1.

In the configuration illustrated in FIG. 1, since amplifiers 11, 12, ..., 1n are provided in parallel exclusively for each of the frequency bands, the number of parts for dedicated amplifiers 11, 12, ..., 1n have increased together with an increase in RF signals in frequency bands different from one another, causing a problem that the size of the area needed for mounting the parts has increased as well as the cost of the entire amplifier.

For solving the problem as mentioned above, there is a technique which amplifies RF signals in two frequency bands with a single amplifier, as disclosed, for example, in JP-A-11-97946. Describing the technique disclosed in this official publication with the same reference numerals given to parts common to FIG. 1, the output of amplifier 1 between impedance matching circuit 2 and impedance conversion circuits 21, 22 is switched by switch circuit 5 to amplify RF signals in two frequency bands as illustrated in FIG. 2, or is switched by first bandpass filter 61 and second bandpass filter 62 to amplify RF signals in two frequency bands as illustrated in FIG. 3.

DISCLOSURE OF THE INVENTION

Problems to be Solved by the Invention

The technique disclosed in JP-A-11-97946 branches RF signals in different frequency bands at the output terminal of low-impedance amplifier 1 using switch circuit 5 shown in FIG. 5 or first bandpass filter 61 and second bandpass filter 62 shown in FIG. 2, thus causing a problem of increased influences resulting from a loss in switch circuit 5 or first bandpass filter 61 and second bandpass filter 62.

Specifically, in the technique which branches RF signals in respective frequency bands by switch circuit 5 or by first bandpass filter 61 and second bandpass filter 62, an attempt to branch RF signals in three or more frequency bands, in particular, tends to cause a larger loss as a plurality of RF signals to be branched is increased.

A problem that the present invention intends to solve is to prevent increased degradation in characteristics of the amplifier due to increased loss which occurs when an attempt is made to amplify RF signals in a plurality of frequency bands by a single amplifier and to branch the RF signals in respective frequency bands.

Means for Solving Problem

A high-frequency amplifier of the present invention is characterized by comprising:
first amplifying means for amplifying an input signal having a plurality of different frequency bands;
a plurality of first branching means each for branching the amplified signal in the plurality of frequency bands into a signal in the highest frequency band and into a signal that includes the remaining frequency bands; and
a plurality of first impedance converting means each for converting the branched signal in the highest frequency band to a load impedance of an output terminal,
wherein the branching in accordance with the level of the frequency band and the conversion to the load impedance are performed in order from the highest frequency band to the lowest frequency band.

In this event, the high-frequency amplifier may comprise:
second amplifying means for amplifying an input signal having a plurality of different frequency bands;
a plurality of second branching means each for branching the amplified signal in the plurality of frequency bands into a signal in the highest frequency band and a signal having the remaining frequency bands; and
a plurality of second impedance converting means each for converting the branched signal in the highest frequency band to a signal source impedance of an input terminal,
wherein the branching in accordance with the level of the frequency band and conversion to the signal source impedance are performed in order from the highest frequency band to the lowest frequency band.

A high-frequency amplifier according to another aspect of the present invention is characterized by comprising:
second amplifying means for amplifying an input signal having a plurality of different frequency bands;
a plurality of second branching means each for branching the amplified signal in the plurality of frequency bands into a signal in the highest frequency band and a signal having the remaining frequency bands; and
a plurality of second impedance converting means each for converting the branched signal in the highest frequency band to a signal source impedance of an input terminal,
wherein the branching in accordance with the level of the frequency band and conversion to the signal source impedance are performed in order from the highest frequency band to the lowest frequency band.

In this event, the number of the plurality of different frequency bands may be three or more.

Also, the first amplifying means and second amplifying means may be connected in cascade, and the first branching means and first impedance converting means may be provided between the first amplifying means and second amplifying means.

Also, the first amplifying means and second amplifying means may be connected in cascade, and the second branching means and second impedance converting means may be provided between the first amplifying means and second amplifying means.

Also, at least one auxiliary amplifier may be provided between the first branching means and an output terminal.

Also, at least one auxiliary amplifier may be provided between the second branching means and an input terminal.

Also, the first impedance converting means may commonly convert signals in at least two frequency bands to a high impedance.

Also, the second impedance converting means may commonly convert signals in at least two frequency bands to a high impedance.

Also, an auxiliary impedance conversion circuit may be provided between the first branching means and an output terminal.

Also, an auxiliary impedance conversion circuit may be provided between the second branching means and an output terminal.

Also, the first branching means may comprise high-pass filters and low pass filters.

Also, the second branching means may comprise high-pass filters and low pass filters.

Also, at least one of the low-pass filters may be configured to selectively increase the impedance for a signal in high frequency bands branched by a high-pass filter which is paired therewith.

Also, at least one of the high-pass filters may be configured to selectively ground the signal in the highest frequency band of the signal branched by a low-pass filter which is paired therewith.

Also, the first branching means may comprise switches using field effect transistors.

Also, the second branching means may comprise switches using field effect transistors.

Also, the first branching means may comprise switches using PIN diodes.

Also, the second branching means may comprise switches using PIN diodes.

Also, the high-frequency amplifier may comprise a switch provided between an output terminal corresponding to the frequency band and a ground, and grounding means operative, when a signal in a frequency band is amplified and transmitted from the output terminal to a load side, to ground at least one of output terminals corresponding to the remaining frequency bands through the switch.

Also, the grounding means may comprise a switch using a field effect transistor.

Also, the grounding means may comprise a switch using a PIN diode.

Also, when the signal in the plurality of different frequency bands includes a signal in a first frequency band and a second frequency band included in a range that is 1.5 to 2.5 times as high as the first frequency band, an output terminal of the second frequency band may be grounded by the grounding means when the amplified signal in the first frequency band is being transmitted from an output terminal to the load side.

Also, a switch may be provided between the output terminal corresponding to the frequency band and the ground through a transmission line having the same characteristic impedance as the load impedance, wherein the transmission line has a length which may be determined such that an impedance when the load side is viewed from an output terminal of the first amplifying means establishes a short-circuit condition in the frequency band when the switch is turned on to connect to the ground.

EFFECT OF THE INVENTION

In the high-frequency amplifier of the present invention, the branching in accordance with the level of the frequency band and conversion to the load impedance are performed in order from the highest frequency band to the lowest frequency band, thus making it possible to convert each signal to a target impedance, and to reduce the influence caused by to signal losses, even if the amplifier branches a signal having a plurality of frequency bands amplified by a single amplifier.

BRIEF DESCRIPTION OF THE DRAWINGS

FIGS. 11(a) and 11(b)
A diagram showing a reflection characteristic at point E and a pass characteristic from point A to point E in FIG. 9.
FIGS. 12(a) and 12(b)
A diagram showing a reflection characteristic at point F and a pass characteristic from point A to point F in FIG. 9.

Figure 4:
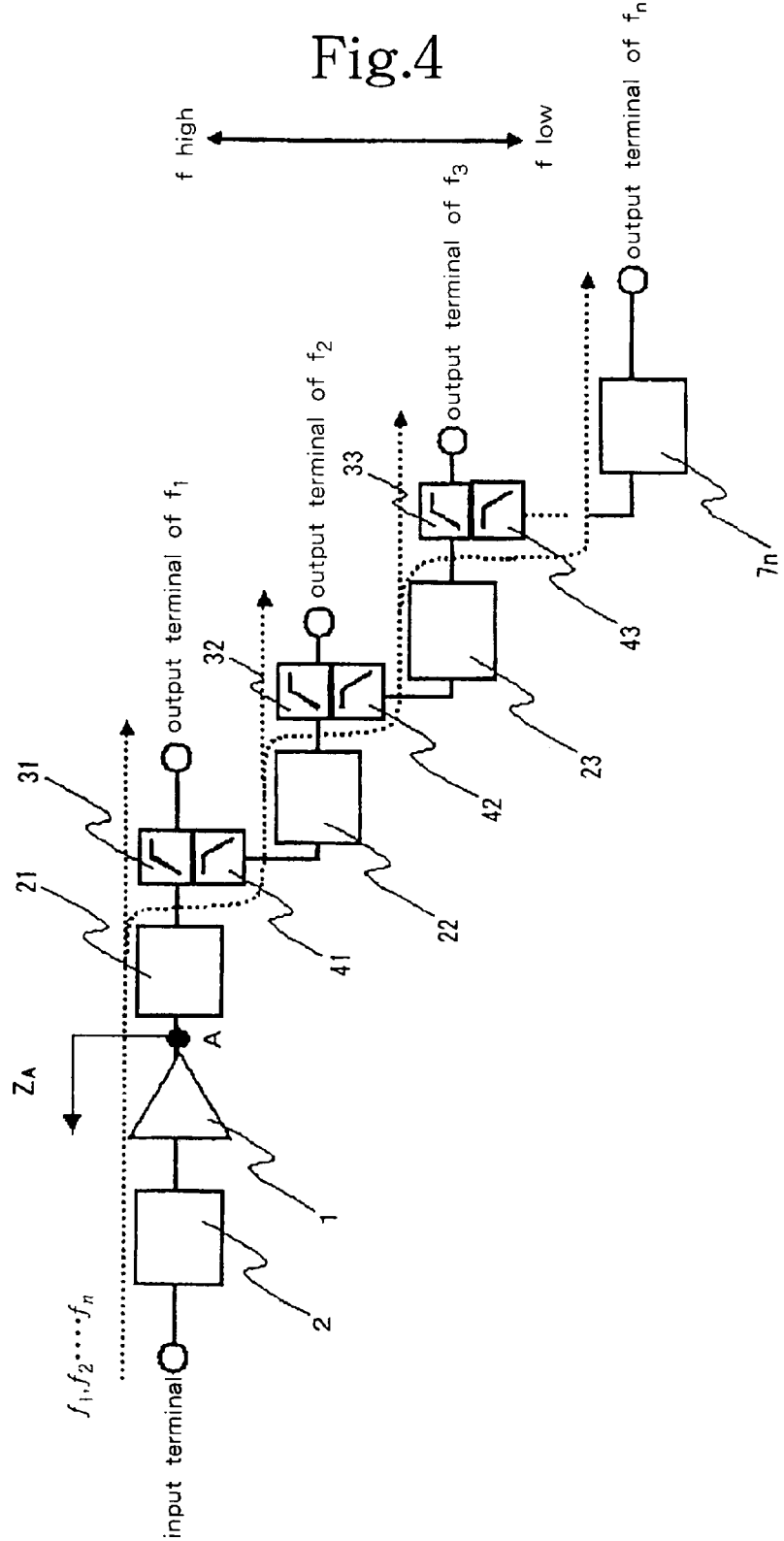
[FIG. 4]
A diagram illustrating Embodiment 1 of a high frequency amplifier of the present invention.

A diagram illustrating Embodiment 10, in which the configuration of the FIG. 4 is modified.

BEST MODE FOR CARRYING OUT THE INVENTION

The present invention amplifies RF signals in a plurality of frequency bands, i.e, RF signals have n different frequencies (f1>f2> . . . >fm> . . . >fn) amplified by a single amplifier, by performing, up to the lowest frequency fn, a conversion to a high impedance and branching in accordance with the level of the frequency, such as a conversion of the RF signals to a higher impedance than the output impedance of the amplifier and subsequent branching into the RF signal at the highest frequency f1 and RF signals including frequencies lower than that, a conversion of the RF signals including the frequencies lower than frequency f1 to an impedance higher than the output impedance of the amplifier and subsequent branching into the RF signal at the highest frequency f2 and RF signals including frequencies lower than that, and so on.

Next, embodiments of the present invention will be described in detail with reference to the drawings.

Embodiment 1

FIG. 4 is a diagram illustrating a first embodiment of a high-frequency amplifier according to the present invention.

As illustrated in FIG. 4, the high-frequency amplifier of this embodiment comprises amplifier 1, impedance matching circuit 2, impedance conversion circuits 21, 22, 23, . . . , auxiliary impedance conversion circuits 7n, high-pass filters 31, 32, 33, and low-pass filters 41, 42, 43, . . . .

Impedance matching circuit 2 matches the impedance for an RF signal including n different frequencies (f1>f2> . . . >fm> . . . >fn) applied through an input terminal.

Amplifier 1, as first amplifying means, amplifies the RF signal including the n different frequencies (f1>f2> . . . > fm> . . . >fn), the impedance of which has been matched by impedance matching circuit 2.

Impedance conversion circuit 21 converts the RF signal including the n different frequencies (f1>f2> . . . > fm> . . . >fn) amplified by amplifier 1 to an impedance higher than the output impedance of amplifier 1 and lower than a load impedance (for example, 50 ohms).

Impedance conversion circuit 22 converts the RF signal having frequencies lower than frequency f1, branched by low-pass filter 41, to a high impedance (≦load impedance, for example, 50 ohms).

Impedance conversion circuit 23 converts the RF signal at frequencies lower than frequency f2, branched by low-pass filter 42, to a high impedance (≦load impedance, for example, 50 ohms).

The impedance conversion circuits and low-pass filters are used in combination, and FIG. 4 illustrates the configuration that has up to three sets of impedance conversion circuits 21-23 and low-pass filters 41-43, but the configuration includes more stages such that an RF signal at frequencies lower than a frequency branched by a low-pass filter of the previous stage is converted to a high impedance by an impedance conversion circuit.

Auxiliary impedance conversion circuit 7n converts the RF signal at the lowest frequency fn, branched by a low pass filter, not shown, of the previous stage, to the load impedance (for example, 50 ohms). These impedance conversion circuits 21, 22, 23, . . . and auxiliary impedance conversion circuit 7n make up first impedance converting means.

High-pass filter 31 passes frequency f1 which has been converted to an impedance (≦load impedance, for example, 50 ohms) higher than the output impedance of amplifier 1 by impedance conversion circuit 21. In this event, if the impedance for frequency f1 is still lower than the load impedance, high-pass filter 31 performs a further impedance conversion for matching to the load impedance. High-pass filter 32 passes frequency f2 which has been converted to a high impedance (≦load impedance, for example, 50 ohms) by impedance conversion circuit 22. In this event, if the impedance for f2 is still lower than the load impedance, high-pass filter 32 performs a further impedance conversion for matching to the load impedance.

High-pass filter 33 passes frequency f3 which has been converted to a high impedance (≦load impedance, for example, 50 ohms) by impedance conversion circuit 23. In this event, if the impedance for frequency f3 is still lower than the load impedance, high-pass filter 33 performs a further impedance conversion for matching to the load impedance.

Low-pass filter 41 passes the RF signal that has frequencies lower than frequency f1 which have been converted to an impedance (≦load impedance, for example, 50 ohms) higher than the output impedance of amplifier 1 by impedance conversion circuit 21. Low-pass filter 42 passes the RF signal having frequencies lower than frequency f2 which have been converted to a high impedance (≦load impedance, for example, 50 ohms) by impedance conversion circuit 22. Low-pass filter 43 passes the RF signal including frequencies lower than frequency f3 which has been converted to a high impedance (≦load impedance, for example, 50 ohms) by impedance conversion circuit 23. These high-pass filters 32, 32, 33, . . . , and low-pass filters 41, 42, 43, . . . , make up first branching means.

Specifically, in Embodiment 1, RF signals in a plurality of frequency bands are amplified by performing a conversion to a high impedance and branching in accordance with the levels of the frequencies, involving the conversion of an RF signal having n different frequencies (f1>f2> . . . > fm> . . . >fn) amplified by a single amplifier to an impedance (≦load impedance, for example, 50 ohms) higher than the output impedance of the amplifier and subsequent branching into the RF signal at the highest frequency f1 and RF signals having frequencies lower than that, a conversion of the RF signals having the frequencies lower than frequency f1 to the impedance (≦load impedance, for example, 50 ohms) that is higher than the output impedance of the amplifier and subsequent branching into the RF signal at the highest frequency f2 and RF signals having frequencies lower than that, and so on, up to the lowest frequency fn, and the impedance is further matched, for example, to 50 ohms for each of the branched frequencies.

While the impedance to be matched is herein set to 50 ohms, this is simply an example, and it should be understood that another value higher than the output impedance of amplifier 1 may be used instead. Also, while impedance conversion circuits 21, 22, 23, . . . are provided at stages previous to filters 31, 32, 33, . . . and low-pass filters 41, 42, 43, . . . , impedance conversion circuits 21, 22, 23 may be provided on the output side of high-pass filters 31, 32, 33, without being limited to the foregoing.

Further, other auxiliary impedance conversion circuits may be added on the output side of high-pass filters 31, 32, 33 . . . . Also, while impedance conversion circuits 21, 22, 23, . . . and auxiliary impedance circuit 7n are provided at stages previous to high-pass filters 31, 32, 33, ... and low-pass filters 41, 42, 43, ..., impedance conversion circuits 22, 23, ... and auxiliary impedance conversion circuit 7n, other than impedance conversion circuit 21, may be omitted depending on the condition of the circuit.

Next, a description will be given of the action of the high-frequency amplifier configured as described above.

First, as an RF signal having n different frequencies (f1>f2> ... >fm> ... >fn) are applied through the input terminal, the impedance of the RF signal is matched over a wide band by impedance matching circuit 2, and is then amplified by amplifier 1. The RF signal amplified by amplifier 1 is converted to an impedance (≦load impedance, for example, 50 ohms) higher than the output impedance of amplifier 1 by impedance conversion circuit 21, and the RF signal at the highest frequency f1 is delivered through high-pass filter 31. In this event, if the impedance for f1 is still lower than the load impedance, high-pass filter 31 performs a further impedance conversion to match it to the load impedance. Further, the RF signal having frequencies lower than frequency f1 is converted to a high impedance (≦load impedance, for example, 50 ohms) by impedance conversion circuit 22 after it has passed low-pass filter 41.

The highest frequency f2, which has been converted to a high impedance (≦load impedance, for example, 50 ohms) by impedance conversion circuit 22, is delivered through high-pass filter 32. In this event, if the impedance for f2 is still lower than the load impedance, high-pass filter 32 performs a further impedance conversion to match it to the load impedance. Further, the RF signal having frequencies lower than frequency f2 is converted to a high impedance (≦load impedance, for example, 50 ohms) by impedance conversion circuit 23 after it has passed low-pass filter 42.

The highest frequency f3, which has been converted to a high impedance (≦load impedance, for example, 50 ohms) by impedance conversion circuit 23, is delivered through high-pass filter 33. In this event, if the impedance for f3 is still lower than the load impedance, high-pass filter 33 performs a further impedance conversion to match it to the load impedance. After the RF signal having frequencies lower than frequency f3 has passed low-pass filter 43, the RF signal is converted to a high impedance (≦load impedance, for example, 50 ohms) by an impedance conversion circuit, not shown, at a subsequent stage.

In this way, the impedance is matched to 50 ohms for each of the frequencies by sequentially performing the conversion to a high impedance (≦load impedance, for example, 50 ohms) and by branching in accordance with the level of the frequency.

Here, when impedance conversion circuits 21, 22, 23, ..., 2n are filter circuits each composed of an inductor (L) and a capacitor (C), and when each frequency is converted from a lower impedance to a higher impedance, the impedance is a function of the frequency in which the higher the frequency higher is the impedance conversion ratio for the same LC circuit. For example, impedance ZA when amplifier 1 is viewed from point A in FIG. 4 is a function of the frequency, where ZA(f1)>ZA(f2)> ... > ZA(fm) ... >ZA(fn) for frequencies f1, f2, ..., fn (f1> f2> ..., >fm> ... >fn).

Therefore, as illustrated in FIG. 4, even if an RF signal having n different frequencies (f1>f2> ... >fm> ... >fn) is branched, each RF signal can be extracted with a small loss by employing the configuration which sequentially branches the RF signal from the highest frequency, converts m-th frequencies fm (m=2, 3, ..., n) to gradually higher impedances by impedance conversion circuits 21, 22, ..., 2m, low-pass filters 41, 42, ... 4(m−1), and high-pass filter 3m, and eventually matches each frequency to 50 ohms.

Also, a higher RF signal, which suffers from a larger loss caused by the signal passing impedance conversion circuits 21, 22, ..., 2n high-pass filters 31, 32, ... 3n, and low-pass filters 41, 42, ... 4n, passes a smaller number of stages of impedance conversion circuits 21, 22, 23, ... 2n, high-pass filters 31, 32, ... 3n, and low-pass filters 41, 42, ... 4n, and this is advantageous for reducing RF signal loss.

Alternatively, a resonator circuit may be introduced into m-th low-pass filter 4m such that the impedance is selectively increased for m-th frequency fm, and a resonator circuit may be introduced into m-th high-pass filter 3m such that (m+1)th frequency fm+1 is selectively grounded. In this configuration, the RF signal in each frequency band can be separated without fail, thereby eliminating leakage of signals at different frequencies to other terminals.

As described above, in Embodiment 1, for an RF signal having n different frequencies (f1>f2> ... >fm> ... >fn) and amplified by a single amplifier, conversion to a high impedance and branching in accordance with the level of the frequency are performed up to the lowest frequency fn in such a manner that the RF signal is converted to an impedance higher than the output impedance of amplifier 1 and then is branched into an RF signal at the highest frequency f1 and into an RF signal having frequencies lower than that; the RF signal having the frequencies lower than frequency f1 is converted to an impedance higher than the output impedance of amplifier 1, and is then branched into an RF signal at the highest frequency f2 and into an RF signal having frequencies lower than that, and so on, up to the lowest frequency fn, and the impedance is matched individually for each of the branched frequencies, so that signals having a plurality of frequency bands amplified by single amplifier 1 can be efficiently branched and amplified with a minimum loss.

Also, because a signal having a plurality of frequency bands amplified by single amplifier 1 can be extracted with a minimum loss, dedicated amplifiers need not be provided in parallel for each of the respective frequency bands of the RF signal, thus solving the problem of an increase in the size of the mounting area and increased cost of the amplifier due to an increased number of parts and the like of the amplifier.

Also, a higher RF signal, which suffers from a larger loss caused by signal passing impedance conversion circuits 21, 22, ..., 2n high-pass filters 31, 32, ... 3n, and low-pass filters 41, 42, ... 4n, passes a smaller number of stages so that amplifier 1 can be less affected by loss due to impedance conversion circuits 21, 22, 23, ... 2n, high-pass filters 31, 32, ... 3n, and low-pass-filters 41, 42, ... 4n, and consequently have improved performance.

Since the high-frequency amplifier is configured to perform conversion to a high impedance and branching in accordance with the level of the frequency up to the lowest frequency fn, the high-frequency amplifier is not limited in the number of frequency bands which can be amplified, and can therefore be applied to a variety of applications.

Second Embodiment

Figure 5:
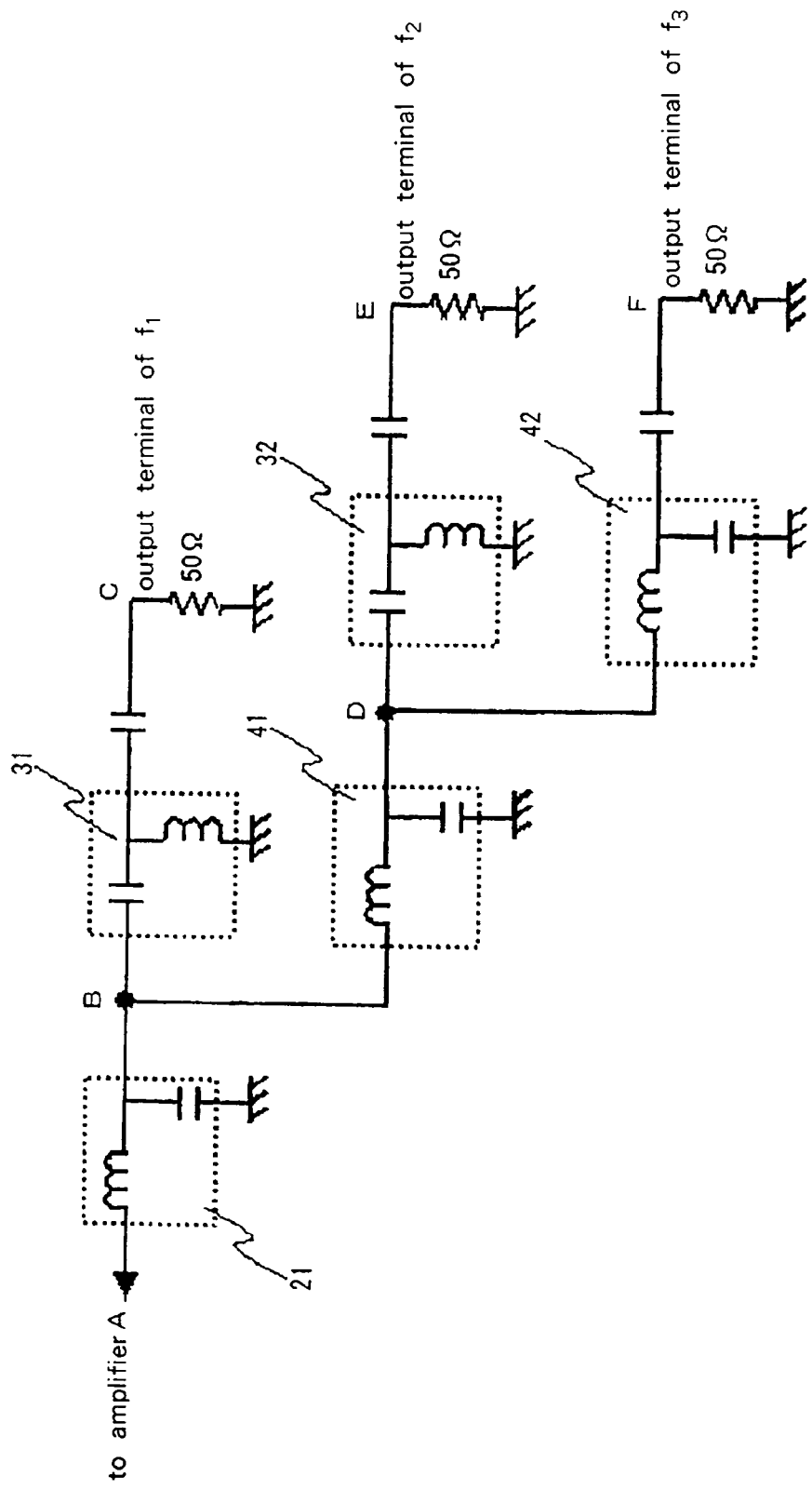
[FIG. 5]
A diagram illustrating Embodiment 2 of the high frequency amplifier of the present invention.
Figure 6:
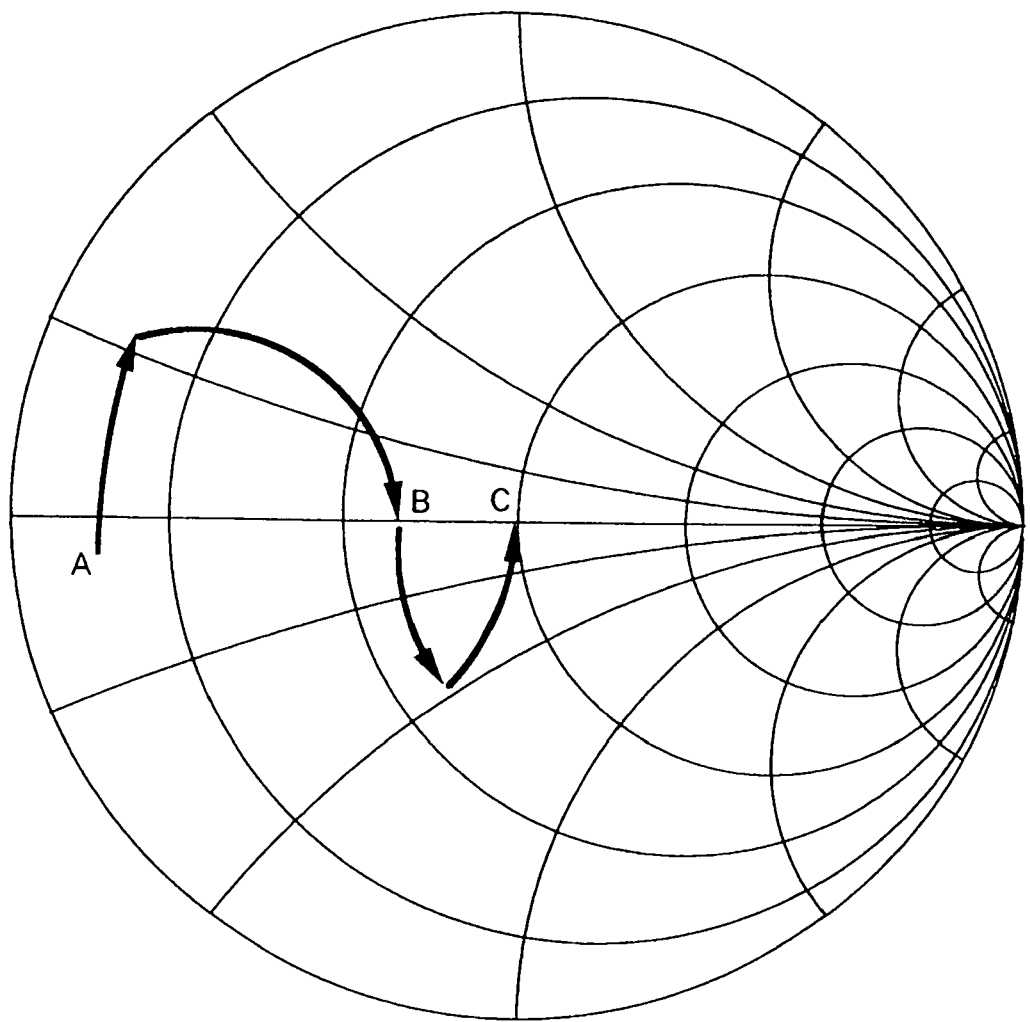
[FIG. 6]
A Smith chart for describing impedances at point A, point B, and point C in FIG. 5.
Figure 7:
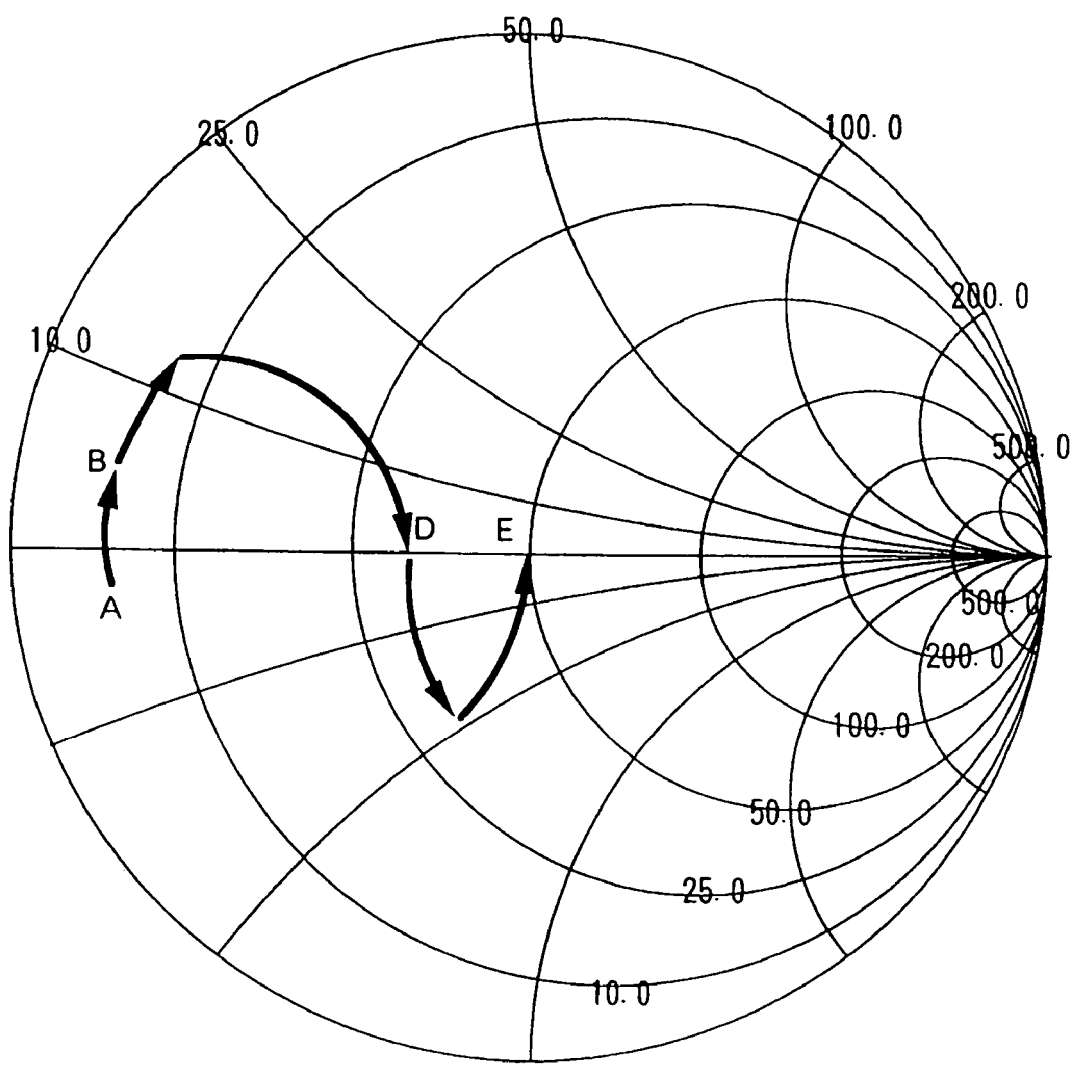
[FIG. 7]
A Smith chart for describing impedances at point A, point B, point D, and point E in FIG. 5.
Figure 8:
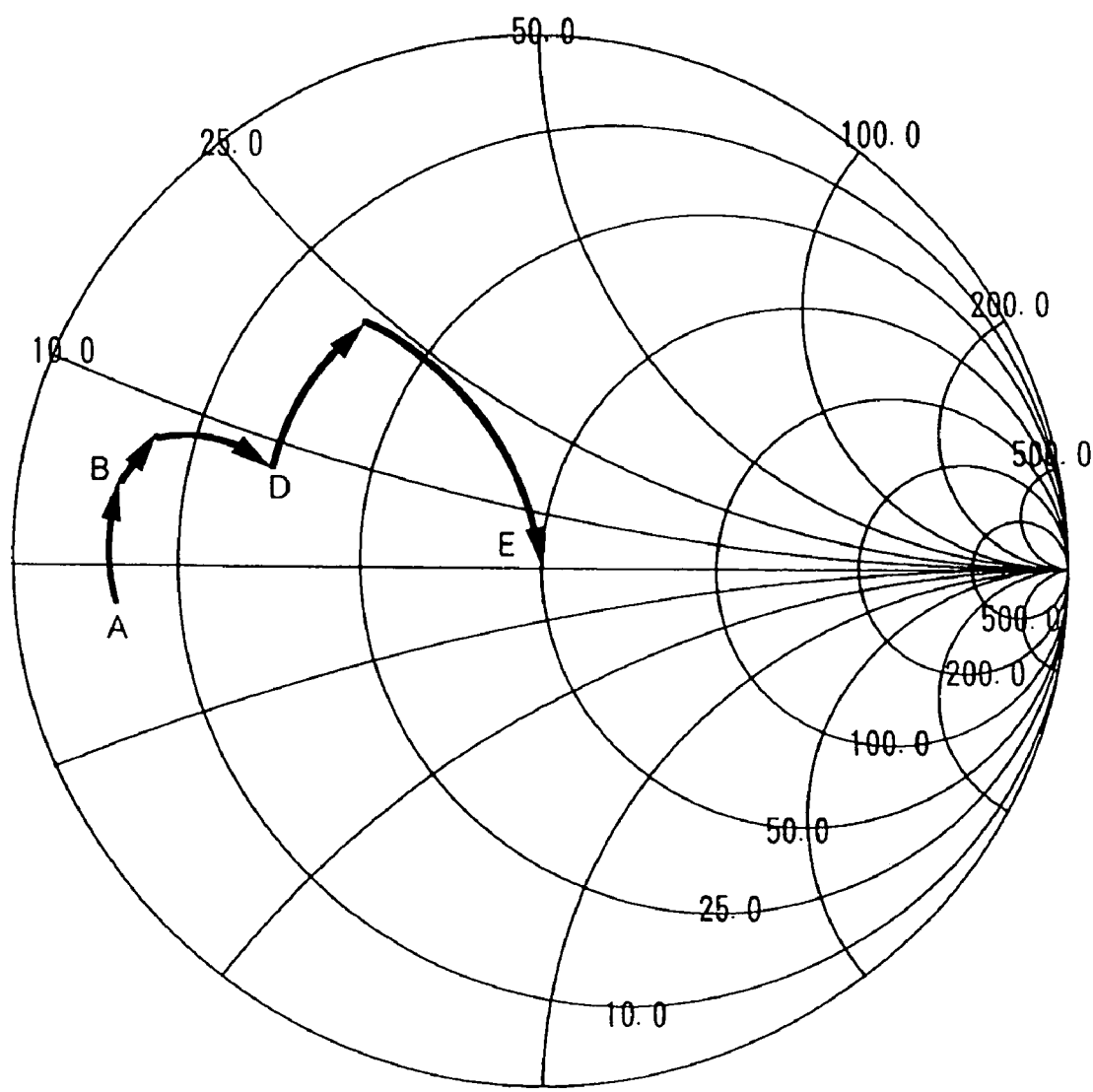
[FIG. 8]
A Smith chart for describing impedances at point A, point B, point D, and point F in FIG. 5.

FIG. 5 is a diagram illustrating Embodiment 2 that shows the high-frequency amplifier of the present invention, and FIGS. 6-8 are Smith charts for describing the impedances at respective points A-F in FIG. 5. In the figures described below, parts common to FIG. 4 are designated the same reference numerals, and repeated descriptions will be omitted.

FIG. 5 illustrates an exemplary configuration of the output side of amplifier 1 in FIG. 4, showing that impedance conversion circuit 21, high-pass filters 31, 32, and low-pass filters 41, 42 are provided to match an RF signal having three frequencies f1, f2, f3 (f1>f2>f3), for example, to 50 ohms. Here, assume for example that frequency f1=5.2 GHz, frequency f2=2.4 GHz, and frequency f3=1.8 GHz.

In such a configuration, from the RF signal having three frequencies f1, f2, f3 converted to a high impedance by impedance conversion circuit 21, frequency f1 passes high-pass filter 31, has its impedance matched to 50 ohms, and outputted. As to frequencies f2, f3, after passing low-pass filter 41, frequency f2 passes high-pass filter 32, has its impedance matched to 50 ohms, and outputted. Frequency f3, in turn, passes low-pass filter 42, and has its impedance matched to 50 ohms, and outputted.

Here, traces of the impedances for frequencies f1, f2, f3 are shown in the Smith charts in FIGS. 6-8. FIG. 6 shows a trace of point A, point B, and point C in FIG. 5; FIG. 7 shows a trace of point A, point B, point D, and point E in FIG. 5; and FIG. 8 shows a trace of point A, point B, point D, and point F in FIG. 5.

For reference, the output impedance of amplifier 1 for use in portable telephones, wireless LAN and the like (impedance when amplifier 1 is viewed from point A in FIG. 5) is generally several ohms or less. When this is passed through impedance conversion circuit 21 common to three frequencies f1, f2, f3, the impedance for frequency f1 at point B in FIG. 5 is converted to several tens of ohms (point B in FIG. 6). Further, by passing frequency f1 through high-pass filter 31, the impedance for frequency f1 is converted to 50 ohms (point C in FIG. 6).

In this event, high-pass filter 31 is designed to only pass frequency f1 but block frequency f2 and frequency f3. Low-pass filter 41 in turn is designed to block frequency f1 and passes frequency f2 and frequency f3. Therefore, the RF signal having frequency f2 and frequency f3 at point B in FIG. 5 is branched by high-pass filter 32 and low-pass filter 42, respectively. Here, the impedance for frequency f2 at point B, which is lower than the impedance for frequency f1, is several ohms.

Therefore, the RF signal having frequency f2 and frequency f3 is converted to several tens of ohms through low-pass filter 41 (point D in FIG. 7), and frequency f2 is further converted to 50 ohms through high-pass filter 32 (point E in FIG. 7).

High-pass filter 32 is designed to pass only frequency f2 and block frequency f3, so that the RF signal at frequency f3 is branched to low-pass filter 42 at point D. The impedance for frequency f3 at point D several ten-ohms (point D in FIG. 8), and converted to 50 ohms (point F in FIG. 8) through low-pass filter 42.

In this way, Embodiment 2 comprises impedance conversion circuit 21, high-pass filters 31, 32, and low-pass filters 41, 42 to match an RF signal having, for example, three frequencies f1, f2, f3 to 50 ohms. As can be understood by seeing the traces of the impedances in FIGS. 6-8, the impedance at each point monotonously increases toward the center of the Smith chart, so that the matching impedance to 50 ohms can be most efficiently achieved for each frequency band.

Also, a higher frequency, which suffers from a larger loss caused by an RF signal passing impedance conversion circuit 21 and the like, passes a smaller number of stages of impedance conversion circuit 21 and the like, so that the influence due to signal loss can be eliminated as mentioned above.

While impedance conversion circuits 22, 23 are omitted in Embodiment 2, this shows that, depending on conditions, they need not be used.

Embodiment 3

Figure 9:
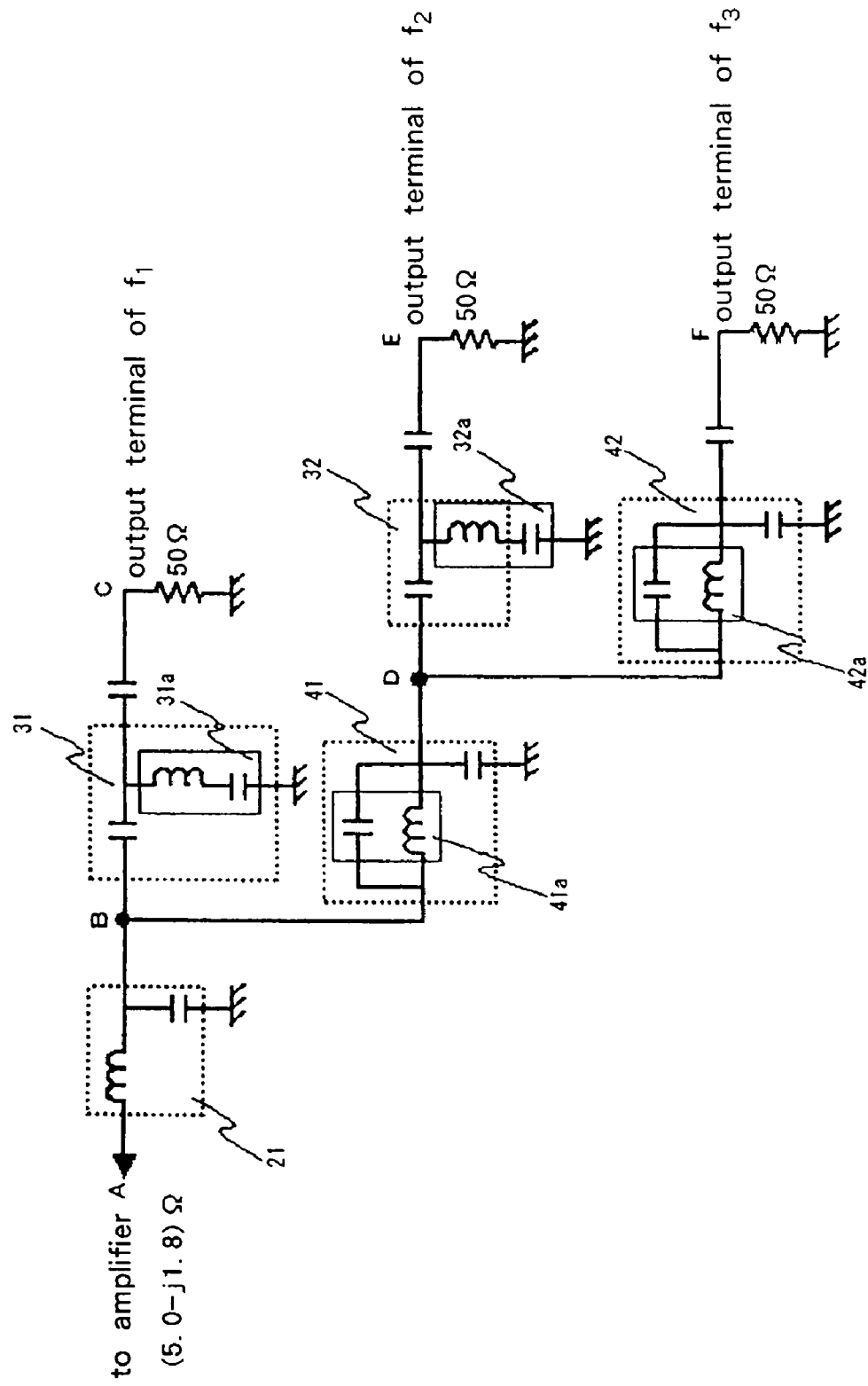
[FIG. 9]
A diagram illustrating Embodiment 3 where the configuration of the high-frequency amplifier of FIG. 5 is modified.
Figure 10:
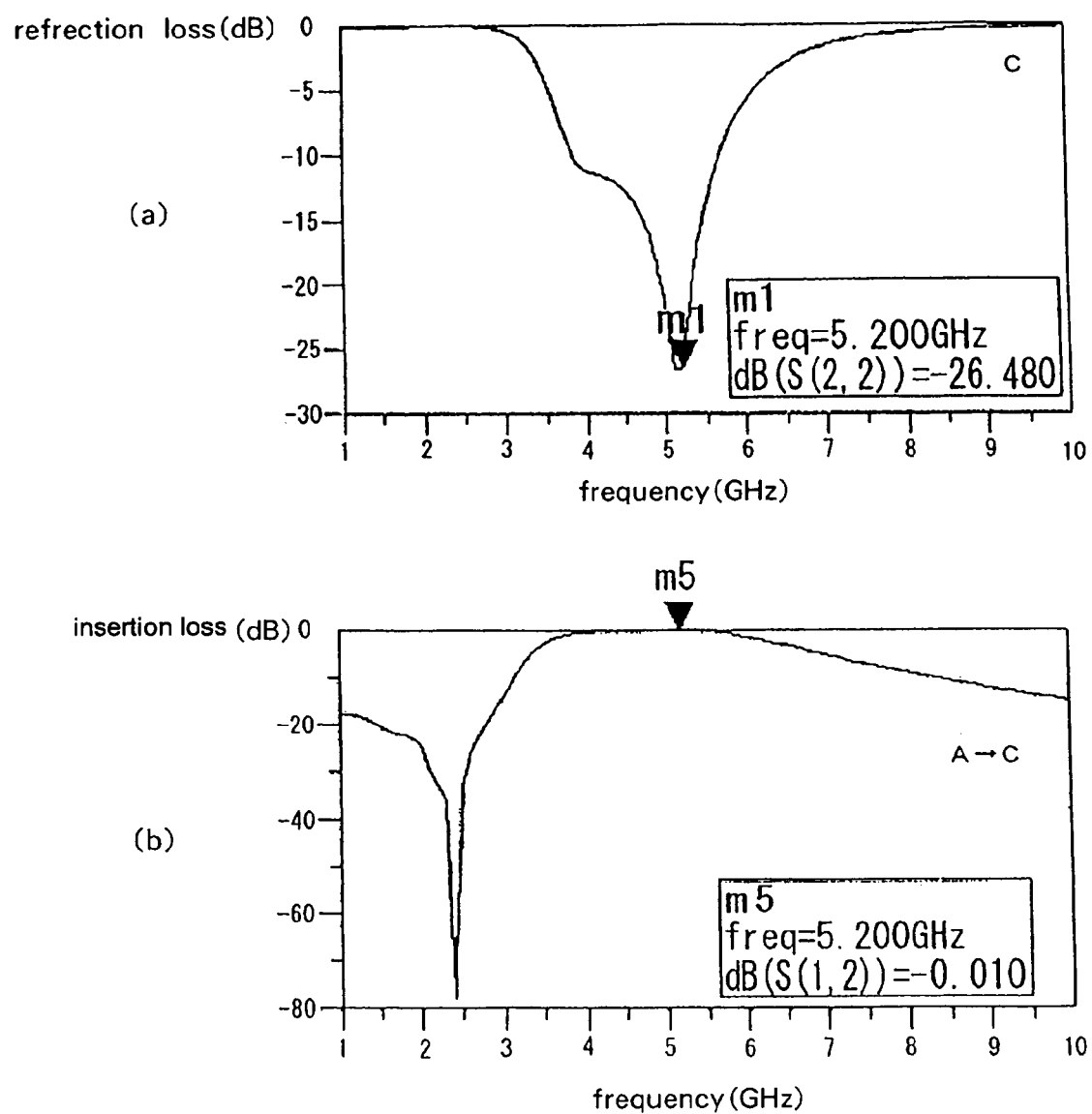
FIGS. 10(a) and 10(b)
A diagram showing a reflection characteristic at point C and a pass characteristic from point A to point C in FIG. 9.

FIG. 9 is a diagram illustrating Embodiment 3 where the configuration of the high-frequency amplifier in FIG. 5 is modified, and FIGS. 10-12 are diagrams for describing pass characteristics at respective points A-F in FIG. 9.

In Embodiment 3, high-pass filters 31, 32 and low-pass filters 41, 42 in FIG. 5 are each provided with a circuit for attenuating a particular frequency. Specifically, as illustrated in FIG. 9, LC parallel resonator circuit 41a is provided in low-pass filter 41, and its resonance frequency ($\approx 1/2 \pi \sqrt{LC}$) is set to be close to frequency f1. Likewise, LC parallel resonator circuit 42a is provided in low-pass filter 42, and its resonance frequency ($\approx 1/2 \pi \sqrt{LC}$) is set to be close to frequency f2.

Here, because the impedance, when the branched circuit is viewed from point B, is extremely large for frequency f1 so that an RF signal at frequency f1 reaches point C in FIG. 6, the RF signal at frequency f1 can be efficiently delivered from an output terminal. Also, since frequency f1 is not introduce into an output terminal of frequency f2, the system will not be adversely affected. Likewise, because the impedance, when viewing the circuit branched after point D, is extremely large for frequency f2 so that an RF signal at frequency f2 reaches point E in FIG. 7, the RF signal at frequency f2 can be efficiently delivered from an output terminal.

Generally, each frequency can be reliably separated without fail by introducing a resonator circuit into m-th low-pass filter 4m which causes an increase in the impedance for m-th frequency fm.

Also, as illustrated in FIG. 9, LC series resonator circuit 31a is provided in high-pass filter 31, and its resonance frequency ($\approx 1/2 \pi \sqrt{LC}$) is set to be close to frequency f2. Likewise, LC series resonator circuit 32a is provided in high-pass filter 32, and its resonance frequency ($\approx 1/2 \pi \sqrt{LC}$) is set to be close to frequency f3.

Here, since most of the RF signals at frequencies f2, f3, for example, that leak from point B to point C are grounded, no RF signals at frequencies f2, f3 will be introduced into point C. For this reason, it is possible to efficiently extract the signal at frequency f1 without adversely affecting the system. Likewise, since most of the RF signal at frequency f3, for example, that leaks from point D to point E, is grounded, no RF signal at frequency f2 will be introduce into point E. For this reason, it is possible to efficiently extract the signal at frequency f2 without adversely affecting the system.

Generally, each frequency can be separated reliably by introducing a resonator circuit into m-th high-pass filter 3m for grounding (m+1)th frequency f(m+1) onward.

Such a configuration is effective for portable telephones, i.e., GSM (Global System for Mobile Communication) which uses a 900 MHz band and DCS (Digital Cellular System) which uses a 1.8 GHz, wireless LAN, i.e., an IEEE802.11b/g standard system which uses a 2.4 GHz band, and an IEEE802.11a standard system which uses a 5 GHz band, and the like.

In such a configuration, when the output impedance of amplifier 1, for example, (5.0-j1.8) ohms, is converted to 50 ohms, the characteristics can be achieved as shown in FIG. 10. Specifically, FIG. 10 shows a reflection characteristic at point C in FIG. 9, and a pass characteristic from point A to point C. It can be seen that the amount of reflection is minimized at frequency f1=5.2 GHz, as shown in FIG. 10(a), and the amount of passage is maximized as shown in FIG. 10(b). It can also be seen that at frequency f2=2.4 GHz, the amount of reflection is maximized shown FIG. 10(a), and the amount of passage is minimized shown FIG. 10(b). In other words, it is understood that the RF signal at frequency f1 is efficiently selected and extracted to point C in FIG. 9.

FIG. 11 in turn shows a reflection characteristic at point E and a pass characteristic from point A to point E is shown in FIG. 9. It can be seen that at frequency f2=2.4 GHz, the amount of reflection is minimized as shown in FIG. 11(a), and the amount of passage is maximum as shown in FIG. 11(b). It can be also seen that at frequency f1=5.2 GHz and at frequency f3=1.8 GHz, the amount of reflection is maximized as shown in FIG. 11(a), and the amount of passage is minimized as shown in FIG. 11(b). In other words, it is understood that the RF signal at frequency f2 is efficiently selected and extracted to point E as shown in FIG. 9.

FIG. 12 in turn shows a reflection characteristic at point F and a pass characteristic from point A to point F is shown in FIG. 9. It can be seen that at frequency f3=1.8 GHz, the amount of reflection is minimized as shown in FIG. 12(a), and the amount of passage is maximized as shown in FIG. 12(b). It can be also seen that at frequencies f=1.52 GHz and f2=2.4 GHz, the amount of reflection is maximized, and the amount of passage is minimized as shown in FIG. 12(b). In other words, it is understood that the RF signal at frequency f3 is efficiently selected and extracted to point F as shown in FIG. 9.

Embodiment 4

Figure 13:
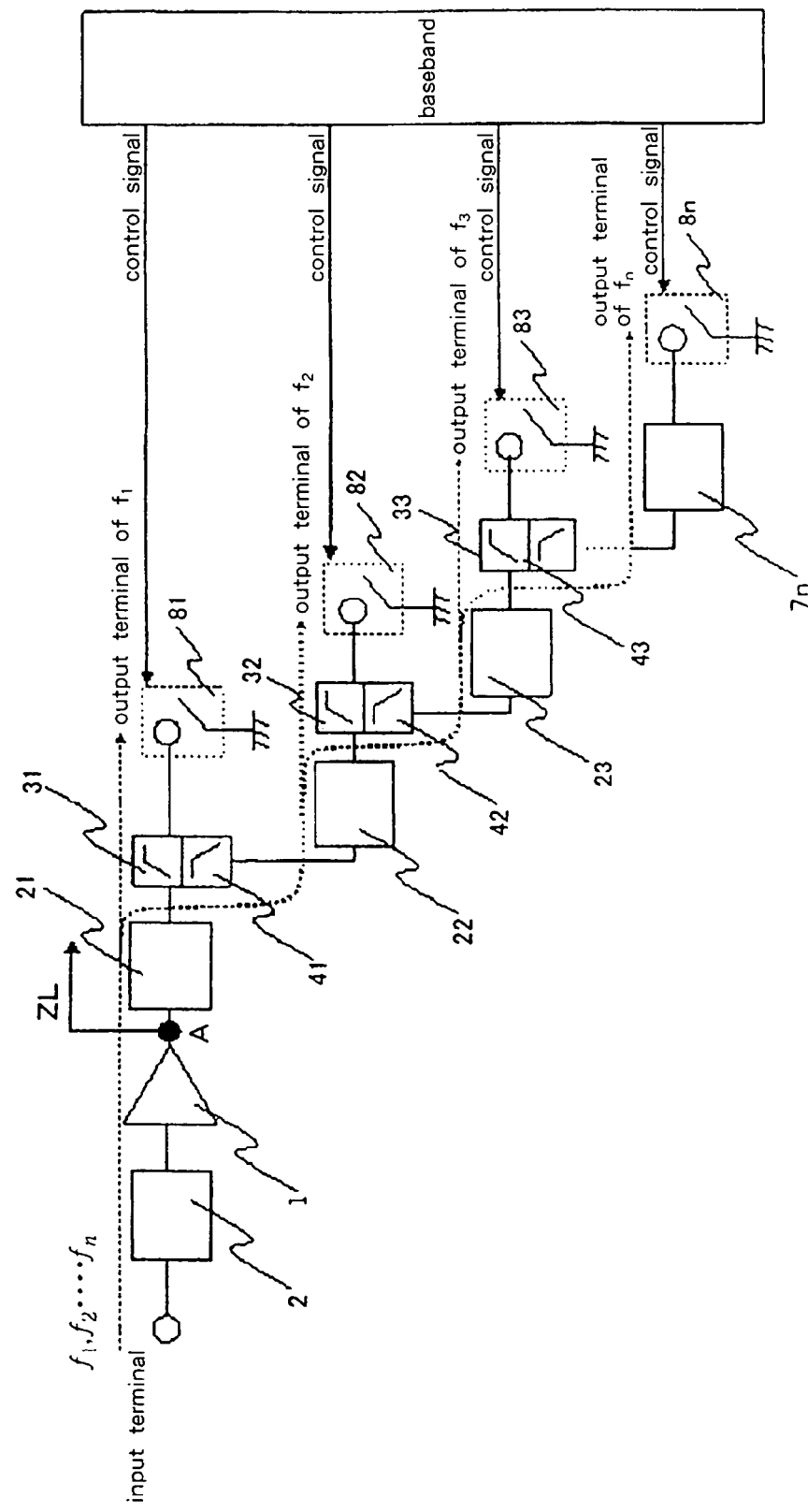
[FIG. 13]
A diagram illustrating Embodiment 4 where the configuration of the high-frequency amplifier of FIG. 4 is modified.

FIG. 13 is a diagram illustrating Embodiment 4 where the configuration of the high-frequency amplifier in FIG. 4 is modified. In Embodiment 4, ground switches 81, 82, 83, . . . are provided at output terminals corresponding to the respective frequencies in FIG. 4.

Ground switch 81 turns on when a signal other than frequency f1 is amplified and transmitted from an output terminal short-circuit on the load side between an output terminal of f1 and a ground, thereby preventing unwanted waves such as signals other than frequency f1 and harmonics thereof and the like from leaking to the load side from the output terminal of f1. Conversely, ground switch 81 turns off when the high frequency amplifier amplifies the signal at frequency f1, and transmits the signal from the output terminal of f1 to the load side.

Ground switch 82 turns on when a signal other than frequency f2 is amplified and transmitted from an output terminal to short-circuit in the load side between an output terminal of f2 and a ground, thereby preventing unwanted waves such as signals other than frequency f2 and harmonics thereof and the like from leaking to the load side from the output terminal of f2. Conversely, ground switch 82 turns off when the high frequency amplifier amplifies the signal at frequency f2, and transmits the signal from the output terminal of f2 to the load side.

Ground switch 83 turns on when a signal other than frequency f3 is amplified and transmitted from an output terminal to short-circuit on the load side between an output terminal of f3 and a ground, thereby preventing unwanted waves such as signals other than frequency f3 and harmonics thereof and the like from leaking to the load side from the output terminal of f3. Conversely, ground switch 83 turns off when the high frequency amplifier amplifies the signal at frequency f3, and transmits the signal from the output terminal of f3 to the load side.

Specifically, in Embodiment 4, output terminals corresponding to frequencies that are not amplified are grounded by the switches to restrain unwanted waves such as signals in other frequency bands and harmonics thereof and the like from leaking to the load side, thereby preventing the system from being adversely affected. In this way, by performing the branching of signals having a plurality of frequency bands and conversion to the load impedance sequentially from the highest frequency to lower frequencies, and further by combining the switches for grounding the output terminals, the effect of removing unwanted waves leaking to output terminals not in use is significantly improved to stabilize the operation of the system, as compared with conventional configurations illustrated in FIGS. 2 and 3.

Figure 1:
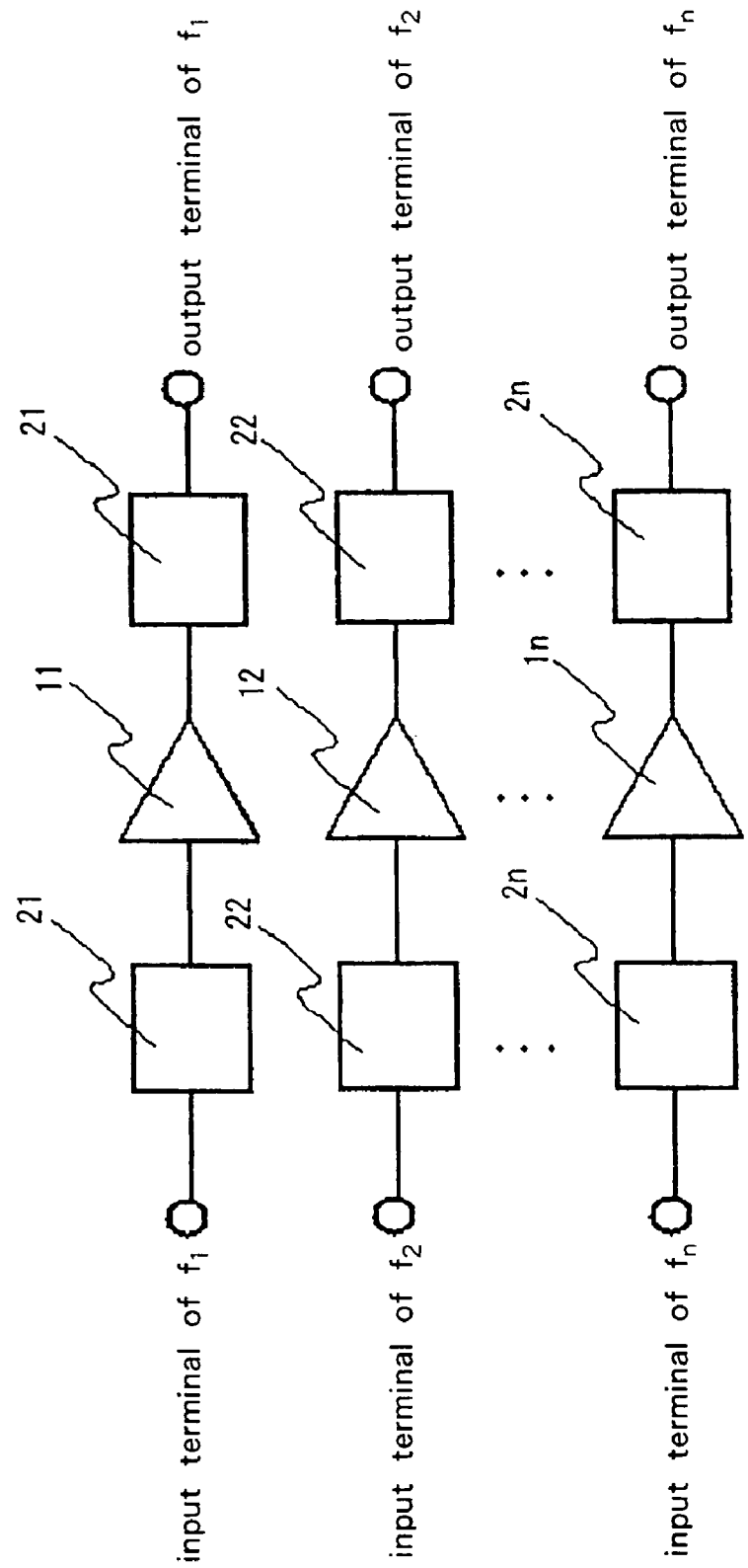
[FIG. 1]
A diagram illustrating an example of a conventional high-frequency amplifier.
Figure 2:
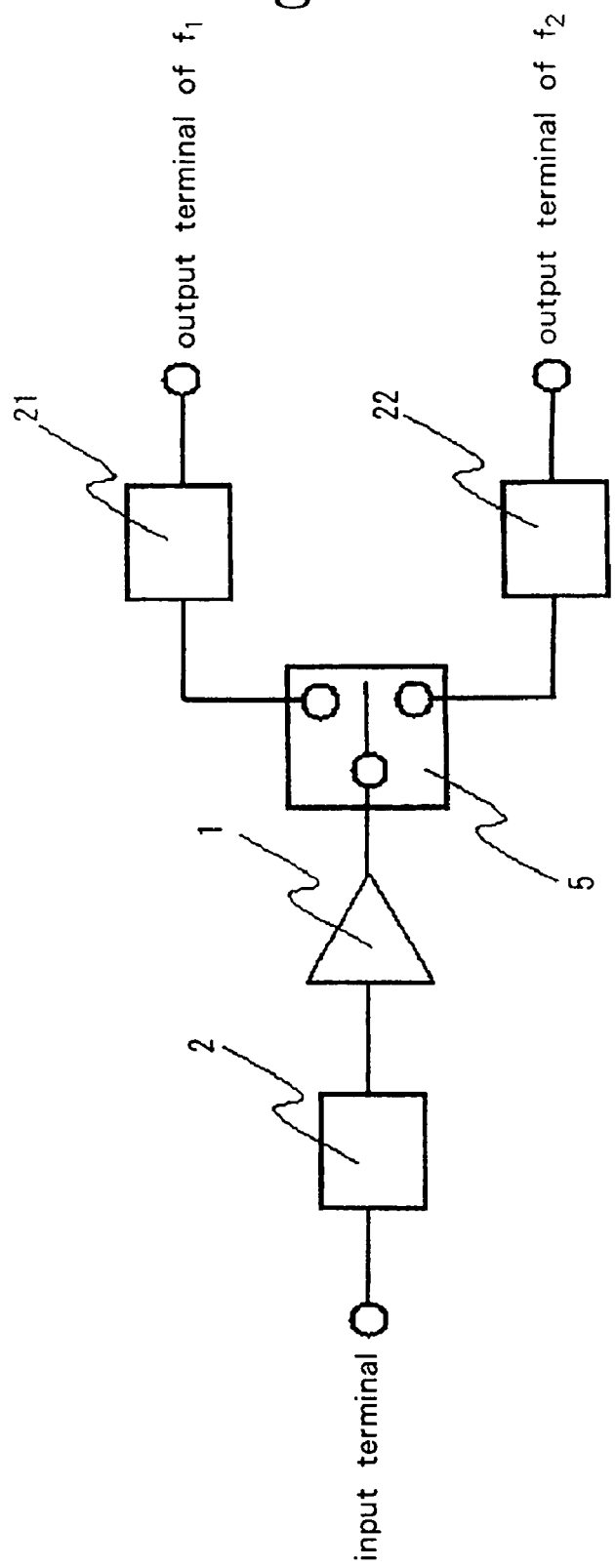
[FIG. 2]
A diagram illustrating another example of a conventional high-frequency amplifier.
Figure 3:
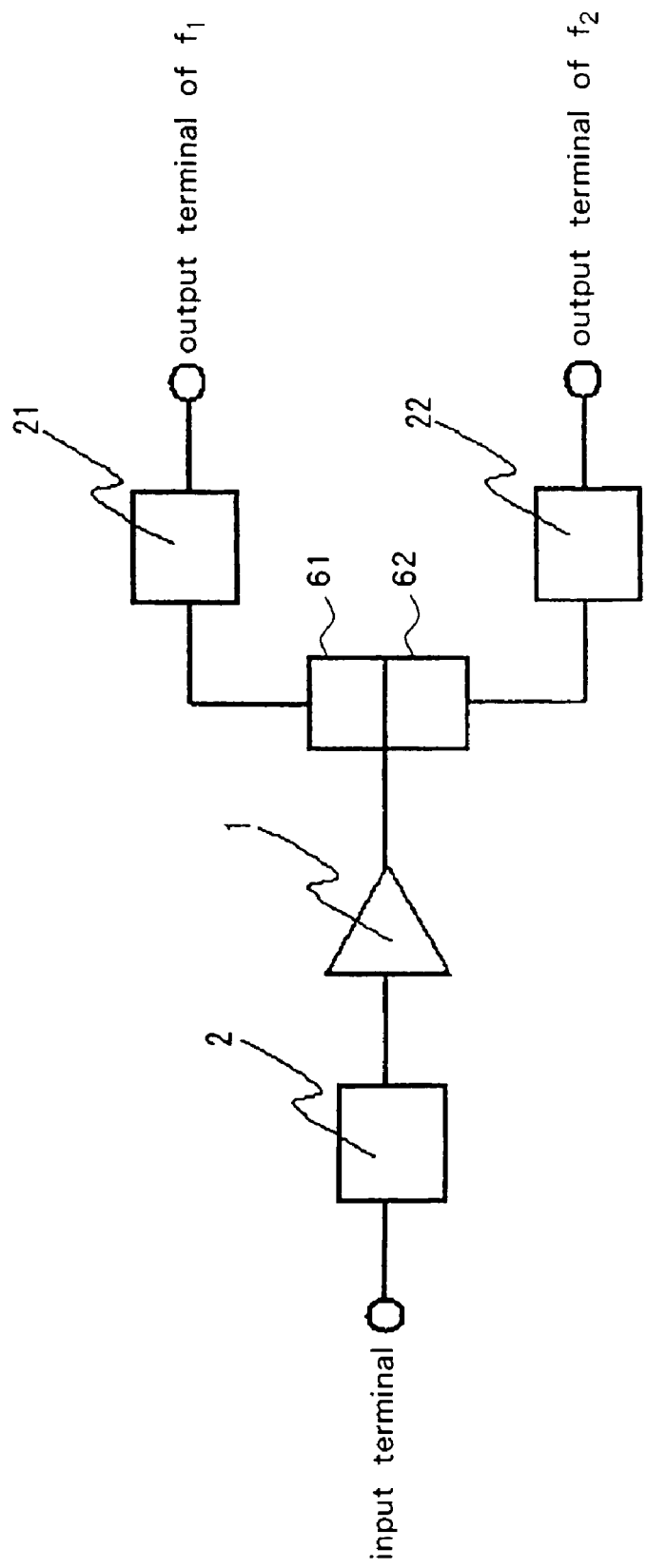
[FIG. 3]
A diagram illustrating another example of a conventional high-frequency amplifier.

Also, in the conventional example illustrated in FIG. 2, switch 5 is required to provide both characteristics of a low loss, for not attenuating a signal to be amplified and delivered, and high isolation for not leaking unwanted waves to the other output terminal not in use, which is technically extremely difficult, whereas in the configuration of the present invention, the ground switches are only required to ground unwanted waves, so that the loss is not problematic even if it is large to some degree, and only the isolation is important. Thus, additional advantages are a performance requirement for the switches that is low and technically easy to implement.

Here, control signals for turning the ground switches on/off can be received, for example, from the baseband. For reference, either field effect transistors or PIN diodes may be used for the switches.

Embodiment 5

Figure 14:
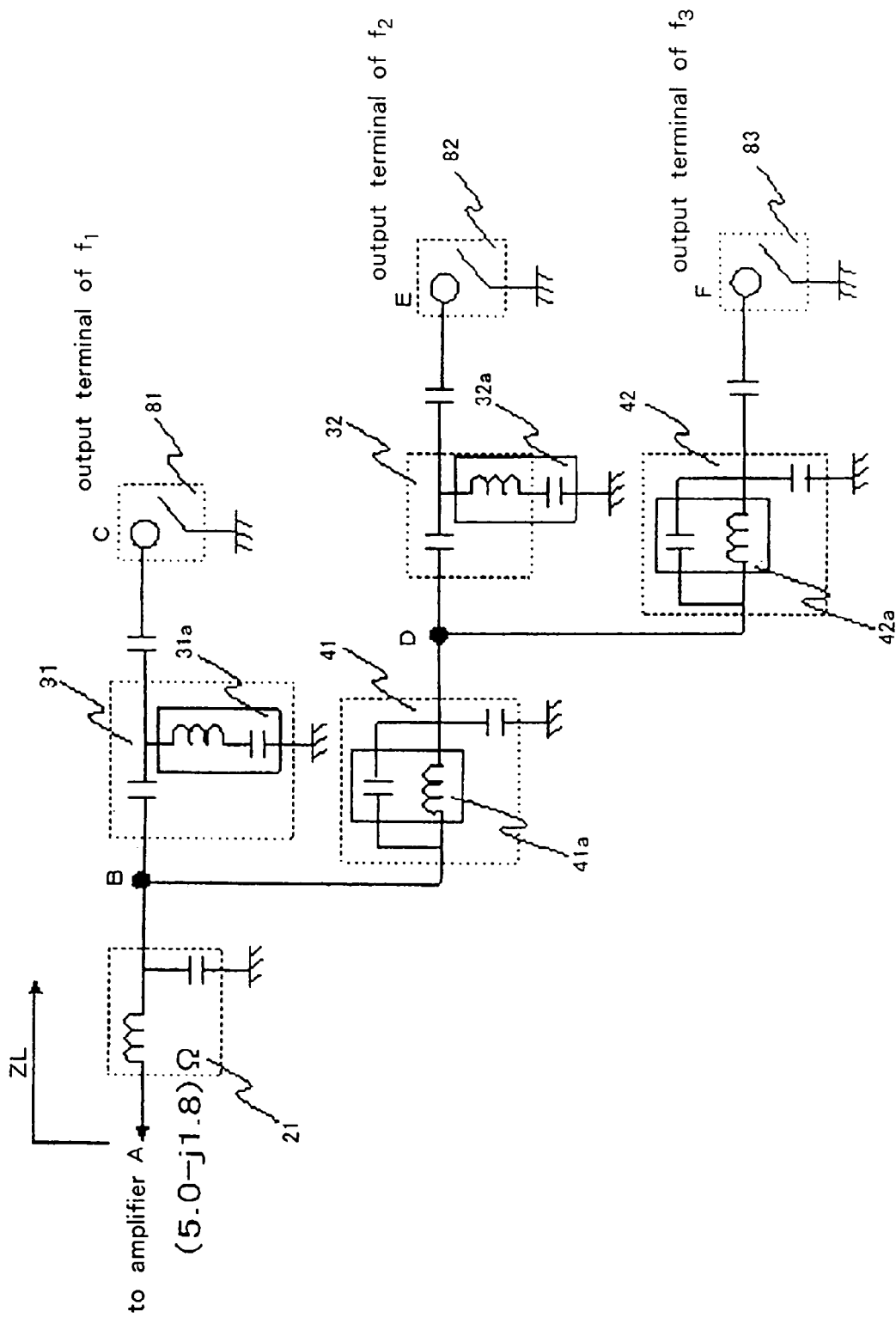
[FIG. 14]
A diagram illustrating Embodiment 5 where the configuration of the high-frequency amplifier of FIG. 9 is modified.
Figure 15:
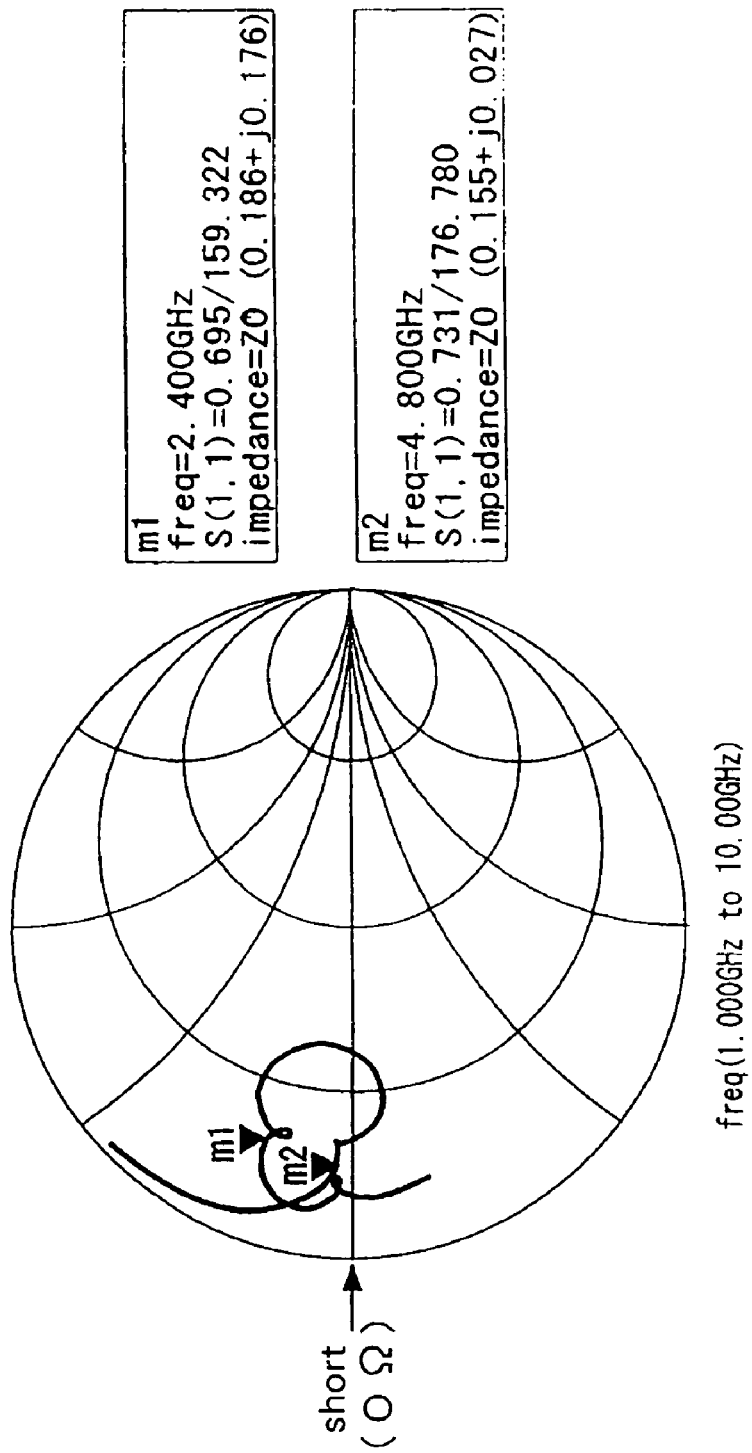
[FIG. 15]
A Smith chart for describing an impedance when a load side viewed from point A in FIG. 9.
Figure 16:
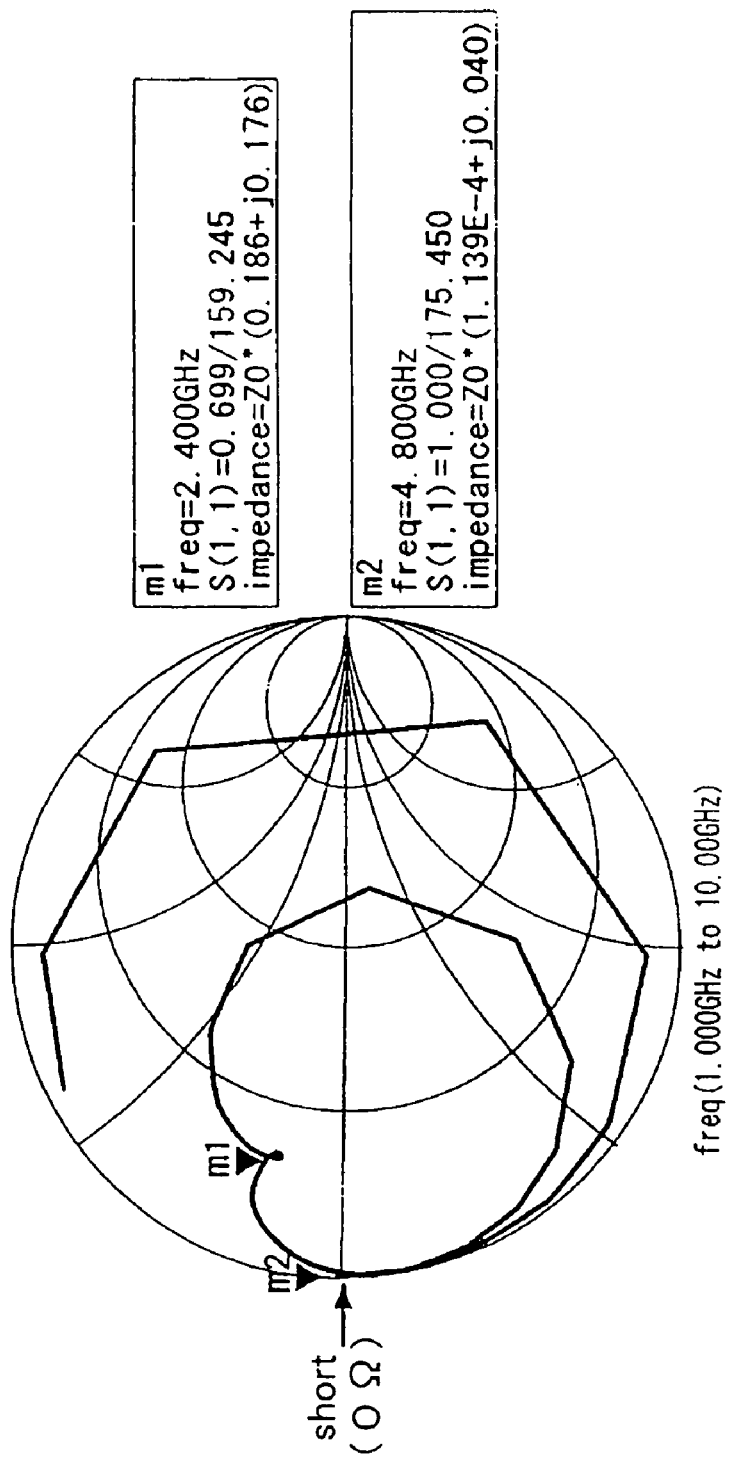
[FIG. 16]
A Smith chart for describing an impedance when a load side viewed from point A in FIG. 14.
Figure 17:
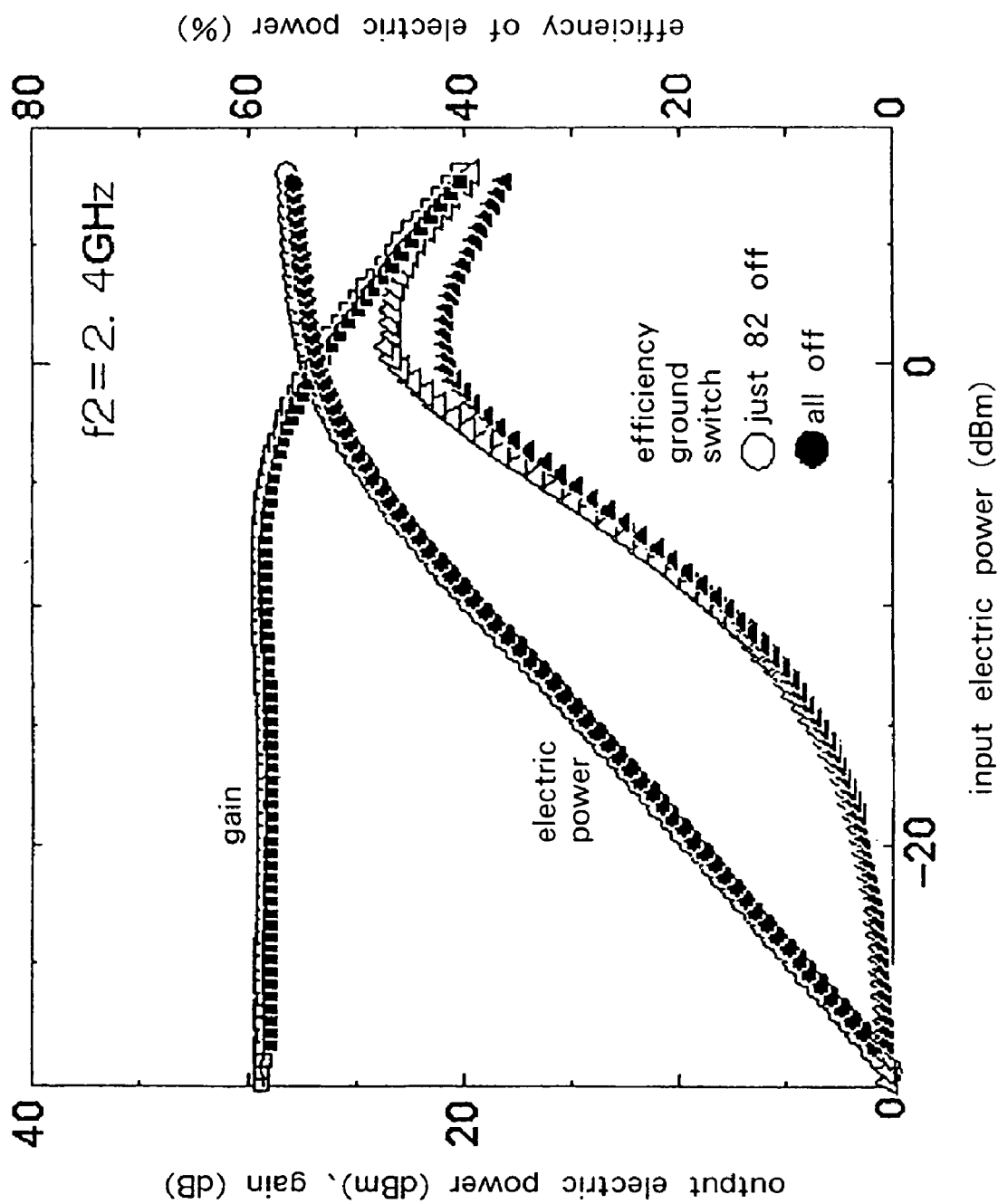
[FIG. 17]
A diagram showing an output power characteristic for describing a secondary effect of Embodiment 5.

FIG. 14 is a diagram illustrating Embodiment 5 which is a modification made to the embodiment of the high frequency amplifier in FIG. 9. FIGS. 15 and 16 are diagrams for describing how impedance ZA, when the load is viewed from amplification terminal A, varies by combinations of on/off of ground switches 81, 82, 83 in FIG. 14, and FIG. 17 is a diagram for describing the secondary effect of above combinations.

In Embodiment 5, ground switch 81 is provided at an output terminal corresponding to frequency f1 in FIG. 9; ground switch 82 at an output terminal corresponding to frequency f2; and ground switch 83 at an output terminal corresponding to frequency f3.

When a signal at frequency f1 is amplified and transmitted from the output terminal to the load side, switch 81 is turned off, while switches 82 and 83 are turned on for grounding.

Likewise, when a signal at frequency f2 is amplified and transmitted from the output terminal to the load side, switch 82 is turned off, while switches 81 and 83 are turned on for grounding.

Likewise, when a signal at frequency f3 is amplified and transmitted from the output terminal to the load side, switch 83 is turned off, while switches 81 and 82 are turned on for grounding.

By doing so, unwanted signals are restrained from leaking to the load side from output terminals through which no signal is transmitted to the load side, so that the system is not adversely affected.

Such a configuration is effective for portable telephones, i.e., GSM (Global System for Mobile Communication) which uses a 900 MHz band and DCS (Digital Cellular System) which uses a 1.8 GHz, wireless LAN, i.e., an IEEE802.11b/g standard system which uses a 2.4 GHz band, and an IEEE802.11a standard system which uses a 5 GHz band, and the like.

Shown in FIG. 15 is a Smith chart that represents the impedance when the load is viewed from point A in FIG. 14 while a signal at frequency f2=2.4 GHz is being amplified with all switches 81, 82, 83 being turned off (i.e., the same state as FIG. 9).

Shown in FIG. 16 is a Smith chart showing impedance ZL when the load is viewed from point A in FIG. 14 while a signal at frequency f2=2.4 GHz is being amplified with switch 82 alone being turned off, and switches 31 and 83 being turned on to ground the output terminals for f1=5.2 GHz and f2=1.8 GHz.

In comparing of both, the impedance for f2=2.4 GHz remains unchanged at (9.3+j8.8) Ω, however, in comparison with the impedance for 4.8 GHz corresponding to twice as high as f2=2.4 GHz, the impedance (7.8+j1.4) Ω in FIG. 15, whereas it is (0.0056+j2.0) Ω which represents a condition close to a short-circuit. This is because the impedance for frequencies near 2 GHz approaches the short-circuit condition by grounding f1=5.2 GHz through switch 81. Generally, in a high-frequency amplifier, when the short-circuit condition is established at the impedance for a second harmonic frequency that is as high as a frequency of a signal to be amplified, an output voltage amplitude waveform approaches an ideal sine wave, and surplus power consumption is restrained in amplifier 1, thus improving the efficiency.

Shown in FIG. 17 is the output power characteristics at f2=2.4 GHz corresponding to the cases where switches 81, 82, 83 in FIG. 15 are all turned off (filled) and where switches 81 and 83 in FIG. 16 are turned on (outlined). When switches 81 and 83 are turned on, the maximum efficiency is improved by 5% or more from 41.7% to 47.2%. This is because impedance ZL at 4.8 GHz that corresponds to an impedance second harmonic frequency that is as f2=2.4 GHz, viewed from point A in FIG. 14, approaches the short-circuit condition by turning switch 81 on to ground the output terminal for f1=5.2 GHz.

Specifically, the configuration illustrated in FIG. 14 is also expected to produce a secondary effect of improving the efficiency of the amplifier in addition to the effect of preventing unwanted waves from leaking to unused output terminals. Generally, in the implementation of FIG. 13, when a signal including a plurality of frequency bands includes frequency fk corresponding to (1.5 to 2.5) times as high as an m-th frequency, the impedance for a second harmonic frequency that is as high as frequency fm approaches the short-circuit condition by grounding an output terminal for frequency fk while frequency fm is being amplified, thus resulting in the secondary effect of improving the efficiency of the high-frequency amplifier when fm is being amplified.

Combinations of applications, for which such an effect is expected, may be combinations of IEEE802.11b/g (2.4 GHz) of wireless LAN with IEEE802.11a (4.9-5.8 GHz), and GSM (880-915 MHz) with DCS(1.71-1.78 GHz), PCS (1.85-1.91 GHz), WCDMA (Wideband Code Division Multiple Access: 1.92-1.98 GHz), and the like.

Embodiment 6

Figure 18:
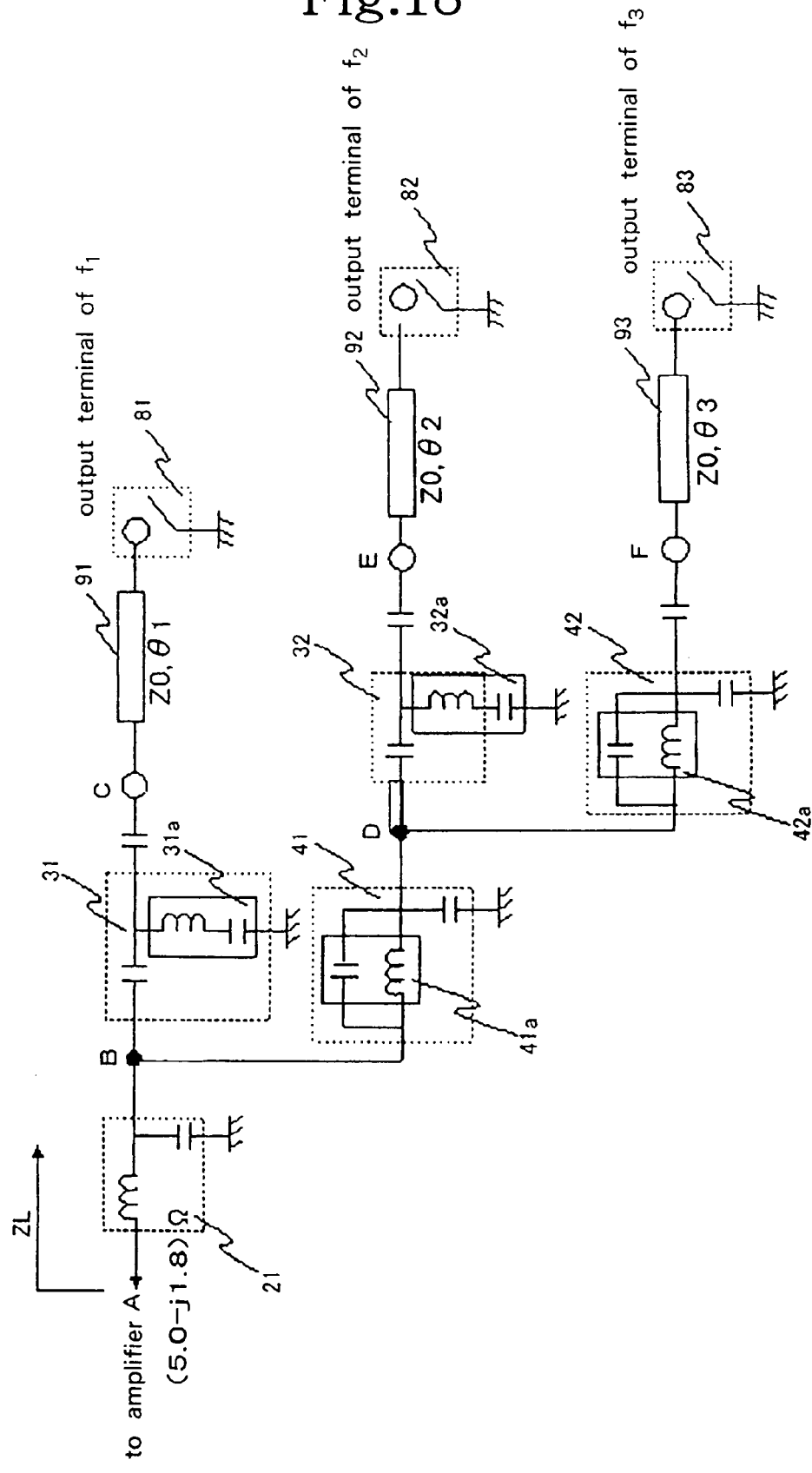
[FIG. 18]
A diagram illustrating Embodiment 6 where the configuration of the high-frequency amplifier of FIG. 14 is modified.

FIG. 18 is a diagram illustrating Embodiment 6 which is a modification made to the high frequency amplifier of FIG. 14.

In Embodiment 6, output terminal C for frequency band f1 is provided with ground switch 81 through transmission line 91 which has the same characteristic impedance Z0 as the load impedance (for example, 50 ohms) of the system, and a length corresponding to phase rotation θ 1. In this event, phase rotation amount θ 1 is adjusted such that impedance ZL, when the load is viewed from output A of the amplifier, establishes the short-circuit condition in frequency band f1 when ground switch 81 is turned on.

Likewise, output terminal E for frequency band f2 is provided with ground switch 82 through transmission line 92 which has the same characteristic impedance Z0 as the load impedance (for example, 50 ohms) of the system and a length corresponding to phase rotation θ 2. In this event, phase rotation amount θ 2 is adjusted such that impedance ZL, when the load is viewed from output A of the amplifier, establishes the short-circuit condition in frequency band f2 when ground switch 82 is turned on.

Likewise, output terminal F for frequency band f3 is provided with ground switch 83 through transmission line 92 which has the same characteristic impedance Z0 as the load impedance (for example, 50 ohms) of the system and a length corresponding to phase rotation θ 3. In this event, phase rotation amount θ 3 is adjusted such that impedance ZL, when the load is viewed from output A of the amplifier, establishes the short-circuit condition in frequency band f3 when ground switch 83 is turned on.

By employing such a configuration, the short-circuit condition in which the second harmonic secondary effect of FIG. 14, shown in FIGS. 15-14, is more correctly satisfied, thus making the effect more prominent.

Embodiment 7

Figure 19:
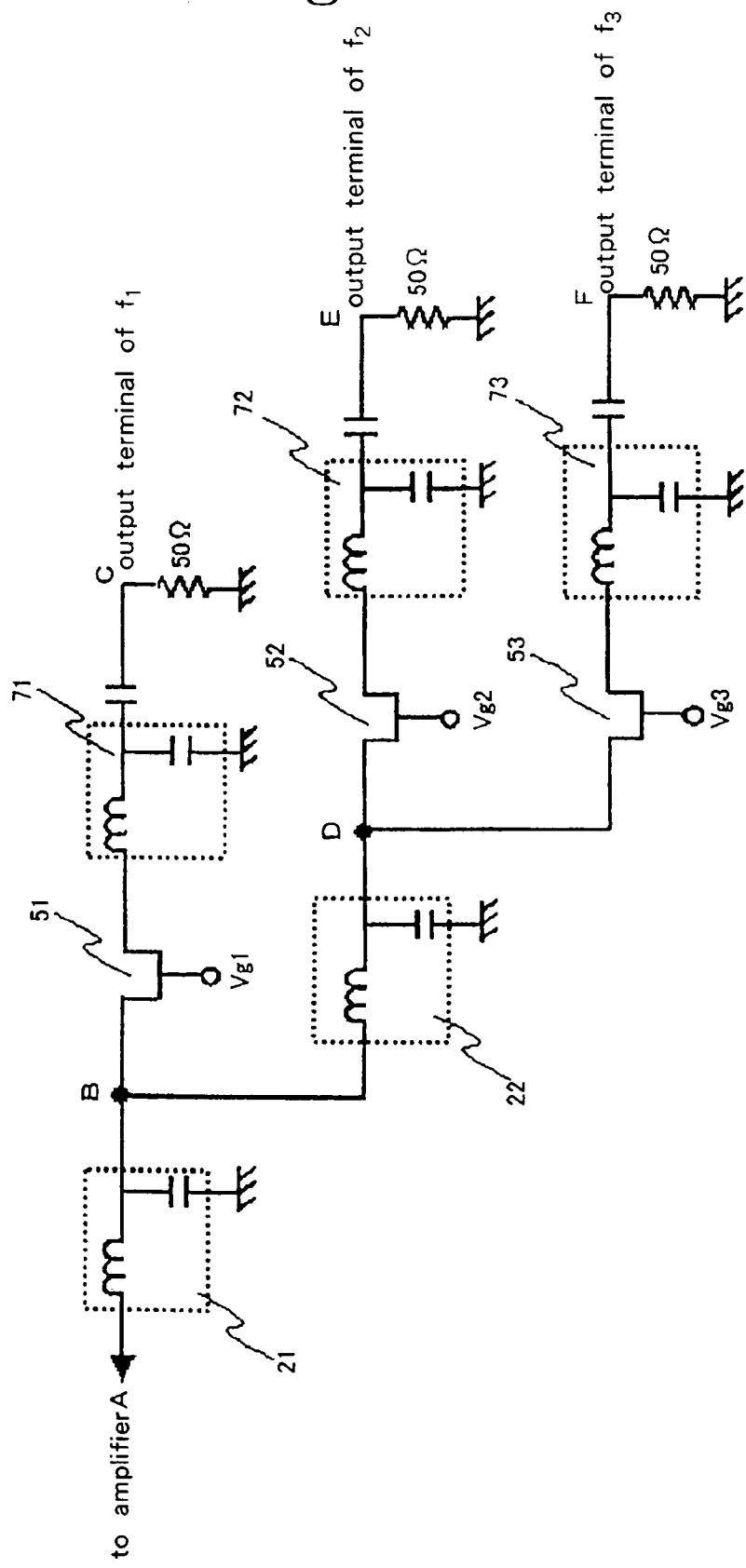
[FIG. 19]
A diagram illustrating Embodiment 7, in which the configuration of the FIG. 5 is modified.

FIG. 19 is a diagram illustrating Embodiment 7 which is a modification to the configuration of FIG. 5.

In FIG. 5, the separation of frequencies f1-f3 is accomplished by a combination of low-pass filters 41, 42 and high-pass filters 31, 32, whereas in Embodiment 7, this is implemented by active switches.

Specifically, as illustrated in FIG. 19, field effect transistors 51, 52, 53 are used at the stages previous to auxiliary impedance conversion circuits 71, 72, 73 as active switches.

In such a configuration, when frequency f1 is amplified, Vg1 of field effect transistor 51 is turned on while Vg2 of field effect transistor 50 and Vg3 of field effect transistor 53 are turned off. When frequency f2 is amplified, Vg2 of field effect transistor 52 is turned on while Vg1 of field effect transistor 81 and Vg3 of field effect transistor 53 are turned off. When frequency f3 is amplified, Vg3 of field effect transistor 53 is turned on while Vg1 of field effect transistor 51 and Vg2 of field effect transistor 52 are turned off.

Here, since field effect transistors 51, 52, 53, which are active switches, do not have the ability to convert impedance, auxiliary impedance conversion circuits 71, 72, 73 are provided between field effect transistor 71, 72, 73 and output terminals, respectively.

Thus, since Embodiment 7 is configured to employ field effect transistors 51, 52, 53 as active switches at the stages previous to auxiliary impedance conversion circuits 71, 72, 73, the conversion to a high impedance and branching in accordance with the level of the frequency can be carried out as described above.

While Embodiment 7 has been described in connection with the configuration in which field effect transistors 51, 52, 53 are used at the stages previous to auxiliary impedance conversion circuits 71, 72, 73 as active switches, field effect transistors 51, 52, 53 may be replaced with PIN diodes.

Embodiment 8

Figure 20:
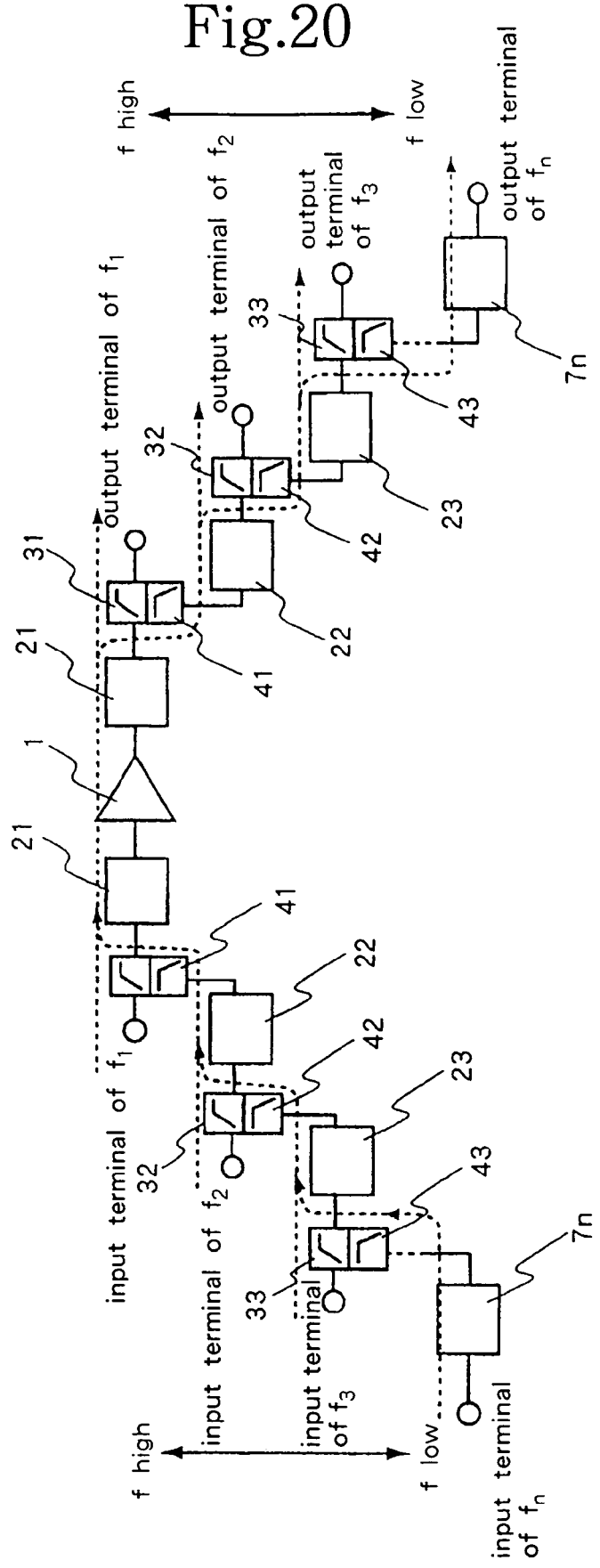
[FIG. 20]
A diagram illustrating Embodiment 8, in which the configuration of the FIG. 4 is modified.

FIG. 20 is a diagram illustrating Embodiment 8 which is a modification to the configuration of FIG. 4.

In FIG. 4, amplifier 1 is provided on its output side with impedance conversion circuits 21, 22, 23, ..., auxiliary impedance conversion circuit 7n, high-pass filters 31, 32, 33, ..., and low-pass filters 41, 42, 43, ..., whereas Embodiment 8 shows the case where they are also provided on the input side. For reference, impedance conversion circuits 21, 22, 23, ... provided on the input side of amplifier 1 make up second impedance converting means, and high-pass filters 31, 32, 33 and low-pass filters 41, 42, 43, ... provided on the input side of amplifier 1 make up second branching means.

In such a configuration, as n different frequencies f1, f2, ..., fn (f1>f2> ... >fn) are applied from their respective input terminals, amplifier 1 amplifies an RF signal which includes frequencies f1, f2, ..., fn, the impedances of which have been converted by respective impedance conversion circuits 21, 22, 23, ..., and auxiliary impedance conversion circuit 7n is provided on the input side of amplifier 1, in a manner similar to that described above, followed by conversion to a high impedance and branching in accordance with the level of the frequency, which are performed as described above up to the lowest frequency fn.

In this way, in Embodiment 8, since amplifier 1 is provided on its input side with impedance conversion circuits 21, 22, 23, ..., auxiliary impedance conversion circuit 7n, high-pass filters 31, 32, 33, ..., and low-pass filters 41, 42, 43, ..., conversion to a high impedance and branching in accordance with the level of the frequency can be carried out as described above.

Embodiment 9

Figure 21:
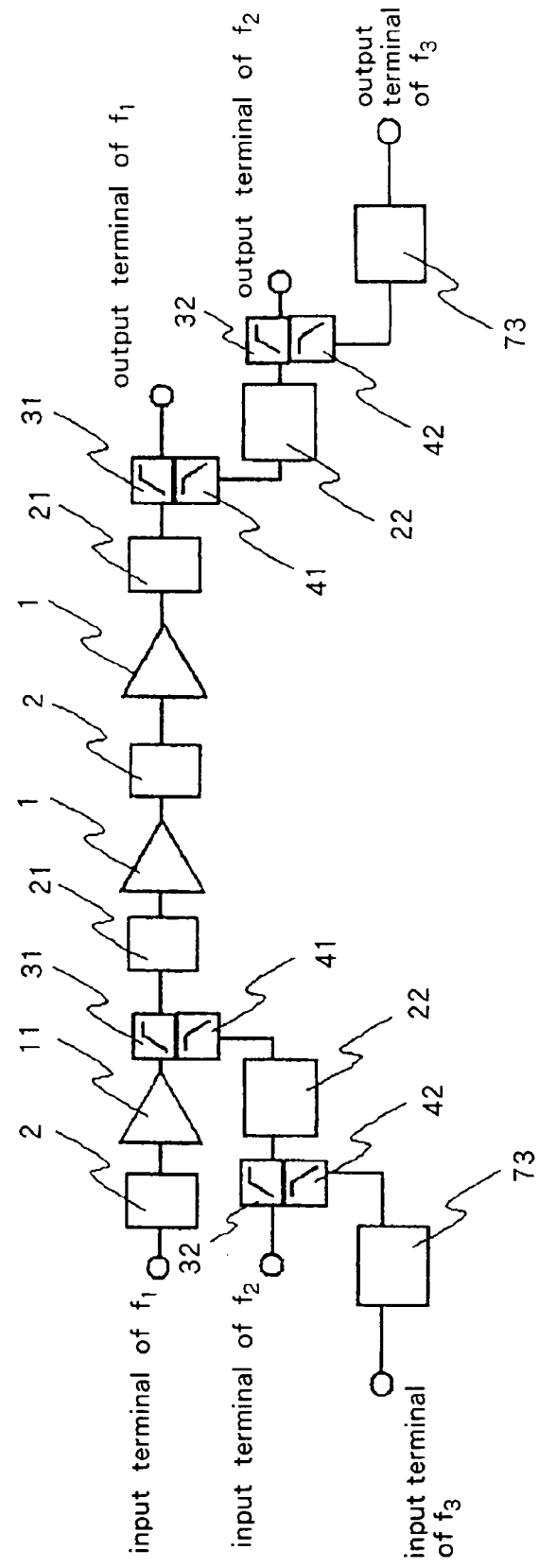
[FIG. 21]
A diagram illustrating Embodiment 9, in which the configuration of the FIG. 4 is modified.

FIG. 21 is a diagram illustrating Embodiment 9 which is a modification to the configuration of FIG. 4.

As illustrated in FIG. 21, Embodiment 9, which shows the case where three different frequencies f1, f2, f3 (f1>f2>f3) are applied, comprises amplifiers 1, 11, impedance matching circuit 2, impedance conversion circuits 21, 22, high-pass filters 31, 32, low-pass filters 41, 42, and auxiliary impedance conversion circuit 73 on the input side of impedance matching circuit 2. Here, amplifier 1 constitutes a second amplifier.

In such a configuration, only frequency f1 is matched by impedance matching circuit 2, and is then combined with other frequencies f2, f3 in impedance conversion circuit 21 after it has been further amplified by amplifier 11. In other words, the aforementioned circuit for performing the conversion to a high impedance and the branching in accordance with the level of the frequency is incorporated between multi-stage amplifiers 1, 11 connected in cascade.

Here, as an example in which such a configuration is effective, a combination of wireless LAN with a portable telephone is given. Here, for example, frequencies f1, f2, f3 fall within a 5 GHz band used by wireless LAN IEEE802.11a standard (frequency f1); a 2.4 GHz band used by IEEE802.11b/g (frequency f2); and a 1.8 GHz band used by portable telephone DCS (frequency f3).

Generally, since a gain per amplifier stage is lower at higher frequencies, amplification stages must be increased, but in this example, a three-stage amplification configuration is employed only for the wireless LAN at frequency f1 in the 5 GHz band, and a two-stage amplification configuration is employed for frequencies f2, f3.

In this way, in Embodiment 9, since amplifiers 1, 11, impedance matching circuit 2, impedance conversion circuits 21, 22, high-pass filters 31, 32, low-pass filters 41, 42, and auxiliary impedance conversion circuit 73 are provided on the input side of impedance matching circuit 2, as indicated by the dotted line that surrounds with them, a stable amplification operation is achieved, for example, with a desired gain produced at 5 GHz and without an unnecessarily high gain at low frequencies. The number of amplifiers 1, 11 and the positions at which they are arranged are not limited to this example, and can be modified as appropriate by allowing an optimal gain to be produced depending on the application.

Embodiment 10

Figure 22:
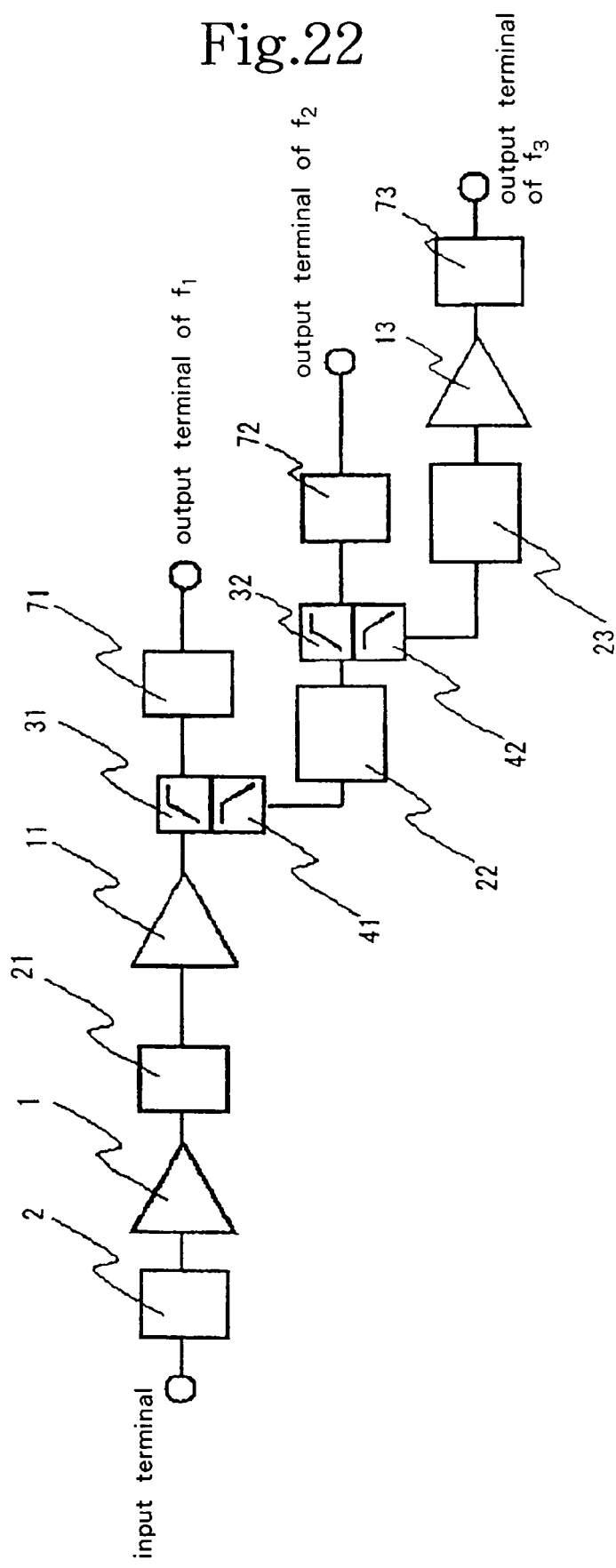
[FIG. 22]

FIG. 22 is a diagram illustrating Embodiment 10 which is a modification to the configuration of FIG. 4.

In Embodiment 10, the size and number of stages of amplifiers are changed in accordance with the output power, and amplifier 11, auxiliary amplifier 13, and auxiliary impedance conversion circuits 71, 72, 73 are incorporated on the output side of impedance conversion circuit 21, as illustrated in FIG. 22.

In such a configuration, an RF signal including three different frequencies f1, f2, f3 (f1>f2>f3) is amplified by amplifier 11, followed by conversion to a high impedance and branching in accordance with the level of the frequency, which are performed as described above.

Here, respective frequencies f1, f2, f3 are converted to 50 ohms through auxiliary impedance conversion circuits 71, 72, 73, and delivered from their respective output terminals. However, only frequency f3 is further amplified by auxiliary amplifier 13.

As an example in which such a configuration is effective, a combination of wireless LAN with a portable telephone is given. Here, frequencies f1, f2 are assigned to wireless LAN signal of the IEEE802.11a/b/g standards, and frequency f3 is assigned to a portable telephone signal of the GSM standard.

While the output power required for amplifier 11 is on the order of 0.3 watts in the former, the output power required for amplifier 11 in the portable telephone of the GSM standard is 2-3 watts, approximately ten times as much as the former. If both are to be amplified by the same amplifier 11, amplifier 11 will suffer from a lower efficiency when it generates small power.

Thus, by employing a configuration which performs conversion to a high impedance and branching in accordance with the level of the frequency as in Embodiment 10, an appropriate size of auxiliary amplifier 13 is selected in each application, so that a high efficiency can be achieved for respective frequencies f1, f2, f3.

In this way, since the size and number of stages of amplifiers are changed in accordance with the output power in Embodiment 10, an appropriate size of auxiliary amplifier 13 is selected in each application, so that high efficiency can be achieved for respective frequencies f1, f2, f3. The position at which auxiliary amplifier 13 is arranged, and the number thereof are not limited to this example, but can be changed as appropriate such that appropriate output power can be produced depending on the application.

While Embodiments 8, 6 have been described in connection with the configuration which also comprises impedance conversion circuits 21, 22, 23, ..., auxiliary impedance conversion circuits 73, 7*n*, high-pass filters 31, 32, 33, . . . , low-pass filters 41, 42, 43, . . . , and the like provided on the input side of amplifier 1 in addition to the output side thereof, impedance conversion circuits 21, 22, 23, . . . , auxiliary impedance conversion circuits 73, 7*n*, high-pass filters 31, 32, 33, . . . , low-pass filters 41, 42, 43, . . . , and the like may be provided only on the input side of amplifier 1, such that an RF signal including a plurality of frequencies (f1>f2> . . . >fm> . . . >fn) is extracted from a single output terminal after it has been amplified by amplifier 1, not limited to these examples.

The invention claimed is:

1. A high-frequency amplifier characterized by comprising:
   first amplifying means for amplifying an input signal having a plurality of different frequency bands;
   a plurality of first branching means each for branching the amplified signal in the plurality of frequency bands into a signal in the highest frequency band and a signal having the remaining frequency bands; and
   a plurality of first impedance converting means each for converting the branched signal in the highest frequency band to a load impedance of an output terminal,
   wherein branching in accordance with the level of the frequency band and conversion to the load impedance are performed in order from the highest frequency band to the lowest frequency band.

2. The high-frequency amplifier according to claim 1, further comprising:
   second amplifying means for amplifying an input signal having a plurality of different frequency bands;
   a plurality of second branching means each for branching the amplified signal in the plurality of frequency bands into a signal in the highest frequency band and a signal having the remaining frequency bands; and
   a plurality of second impedance converting means each for converting the branched signal in the highest frequency band to a signal source impedance of an input terminal,
   wherein branching in accordance with the level of the frequency band and conversion to the signal source impedance are performed in order from the highest frequency band to the lowest frequency band.

3. A high-frequency amplifier further comprising:
   second amplifying means for amplifying an input signal having a plurality of different frequency bands;
   a plurality of second branching means each for branching the amplified signal in the plurality of frequency bands into a signal in the highest frequency band and a signal having the remaining frequency bands; and
   a plurality of second impedance converting means each for converting the branched signal in the highest frequency band to a signal source impedance of an input terminal,
   wherein branching in accordance with the level of the frequency band and conversion to the signal source impedance are performed in order from the highest frequency band to the lowest frequency band.

4. The high-frequency amplifier according to any of claim 1, wherein the number of the plurality of different frequency bands is three or more.

5. The high-frequency amplifier according to claim 2, wherein said first amplifying means and second amplifying means are connected in cascade, and said first branching means and first impedance converting means are provided between said first amplifying means and second amplifying means.

6. The high-frequency amplifier according to claim 2, wherein said first amplifying means and second amplifying means are connected in cascade, and said second branching means and second impedance converting means are provided between said first amplifying means and second amplifying means.

7. The high-frequency amplifier according to claim 1, wherein at least one auxiliary amplifier is provided between said first branching means and said output terminal.

8. The high-frequency amplifier according to claim 2, wherein at least one auxiliary amplifier is provided between said second branching means and said input terminal.

9. The high-frequency amplifier according to claim 1, wherein said first impedance converting means commonly convert signals in at least two frequency bands to a high impedance.

10. The high-frequency amplifier according to claim 2, wherein said second impedance converting means commonly convert signals in at least two frequency bands to a high impedance.

11. The high-frequency amplifier according to claim 1, wherein an auxiliary impedance conversion circuit is provided between said first branching means and said output terminal.

12. The high-frequency amplifier according to claim 2, wherein an auxiliary impedance conversion circuit is provided between said second branching means and said output terminal.

13. The high-frequency amplifier according to claim 1, wherein said first branching means comprises high-pass filters and low pass filters.

14. The high-frequency amplifier according to claim 2, wherein said second branching means comprises high-pass filters and low pass filters.

15. The high-frequency amplifier according to claim 13, wherein at least one of said low-pass filters is configured to selectively increase the impedance for a signal in high frequency bands branched by a high-pass filter which is paired therewith.

16. The high-frequency amplifier according to claim 13, wherein at least one of said high-pass filters is configured to selectively ground the signal in the highest frequency band of the signal branched by a low-pass filter which is paired therewith.

17. The high-frequency amplifier according to claim 1, wherein said first branching means comprise switches using field effect transistors.

18. The high-frequency amplifier according to claim 2, wherein said second branching means comprise switches using field effect transistors.

19. The high-frequency amplifier according to claim 1, wherein said first branching means comprise switches using PIN diodes.

20. The high-frequency amplifier according to claim 2, wherein said second branching means comprise switches using PIN diodes.

21. The high-frequency amplifier according to claim 1, further comprising a switch provided between an output terminal, corresponding to the frequency band, and a ground, and grounding means operative, when a signal in a frequency band is amplified and transmitted from the output terminal to a load side, in order to ground at least one of the output terminals corresponding to the remaining frequency bands through said switch.

22. The high-frequency amplifier according to claim 21, wherein said grounding means comprises a switch using a field effect transistor.

23. The high-frequency amplifier according to claim 21, wherein said grounding means comprises a switch using a PIN diode.

24. The high-frequency amplifier according to claim 21, wherein when the signal in the plurality of different frequency bands includes a signal in a first frequency band and a second frequency band having a range that is 1.5 to 2.5 times as high as the first frequency band, an output terminal of the second frequency band is grounded by said grounding means when the amplified signal in the first frequency band is being transmitted from an output terminal to the load side.

25. The high-frequency amplifier according to any of claim 21, further comprising a switch that is provided between the output terminal corresponding to the frequency band and the ground through a transmission line having the same characteristic impedance as the load impedance, wherein said transmission line has a length which is determined such that an impedance, when the load side is viewed from an output terminal of said first amplifying means, establishes a short-circuit condition in the frequency band when said switch is turned on to connect to the ground.

26. The high-frequency amplifier according to any of claim 2, wherein the number of the plurality of different frequency bands is three or more.

27. The high-frequency amplifier according to any of claim 3, wherein the number of the plurality of different frequency bands is three or more.

28. The high-frequency amplifier according to claim 2, wherein at least one auxiliary amplifier is provided between said first branching means and said output terminal.

29. The high-frequency amplifier according to claim 5, wherein at least one auxiliary amplifier is provided between said first branching means and said output terminal.

30. The high-frequency amplifier according to claim 6, wherein at least one auxiliary amplifier is provided between said first branching means and said output terminal.

31. The high-frequency amplifier according to claim 3, wherein at least one auxiliary amplifier is provided between said second branching means and said input terminal.

32. The high-frequency amplifier according to claim 5, wherein at least one auxiliary amplifier is provided between said second branching means and said input terminal.

33. The high-frequency amplifier according to claim 6, wherein at least one auxiliary amplifier is provided between said second branching means and said input terminal.

34. The high-frequency amplifier according to claim 2, wherein said first impedance converting means commonly convert signals in at least two frequency bands to a high impedance.

35. The high-frequency amplifier according to claim 5, wherein said first impedance converting means commonly convert signals in at least two frequency bands to a high impedance.

36. The high-frequency amplifier according to claim 7, wherein said first impedance converting means commonly convert signals in at least two frequency bands to a high impedance.

37. The high-frequency amplifier according to claim 3, wherein an auxiliary impedance conversion circuit is provided between said second branching means and said output terminal.

38. The high-frequency amplifier according to claim 5, wherein an auxiliary impedance conversion circuit is provided between said second branching means and said output terminal.

39. The high-frequency amplifier according to claim 6, wherein an auxiliary impedance conversion circuit is provided between said second branching means and said output terminal.

40. The high-frequency amplifier according to claim 7, wherein an auxiliary impedance conversion circuit is provided between said second branching means and said output terminal.

41. The high-frequency amplifier according to claim 8, wherein an auxiliary impedance conversion circuit is provided between said second branching means and said output terminal.

42. The high-frequency amplifier according to claim 10, wherein an auxiliary impedance conversion circuit is provided between said second branching means and said output terminal.

43. The high-frequency amplifier according to claim 2, wherein said first branching means comprises high-pass filters and low pass filters.

44. The high-frequency amplifier according to claim 5, wherein said first branching means comprises high-pass filters and low pass filters.

45. The high-frequency amplifier according to claim 6, wherein said first branching means comprises high-pass filters and low pass filters.

46. The high-frequency amplifier according to claim 7, wherein said first branching means comprises high-pass filters and low pass filters.

47. The high-frequency amplifier according to claim 9, wherein said first branching means comprises high-pass filters and low pass filters.

48. The high-frequency amplifier according to claim 11, wherein said first branching means comprises high-pass filters and low pass filters.

49. The high-frequency amplifier according to claim 3, wherein said second branching means comprises high-pass filters and low pass filters.

50. The high-frequency amplifier according to claim 5, wherein said second branching means comprises high-pass filters and low pass filters.

51. The high-frequency amplifier according to claim 6, wherein said second branching means comprises high-pass filters and low pass filters.

52. The high-frequency amplifier according to claim 7, wherein said second branching means comprises high-pass filters and low pass filters.

53. The high-frequency amplifier according to claim 8, wherein said second branching means comprises high-pass filters and low pass filters.

54. The high-frequency amplifier according to claim 10, wherein said second branching means comprises high-pass filters and low pass filters.

55. The high-frequency amplifier according to claim 12, wherein said second branching means comprises high-pass filters and low pass filters.

56. The high-frequency amplifier according to claim 2, wherein said first branching means comprise switches using PIN diodes.

57. The high-frequency amplifier according to claim 5, wherein said first branching means comprise switches using PIN diodes.

58. The high-frequency amplifier according to claim 6, wherein said first branching means comprise switches using PIN diodes.

59. The high-frequency amplifier according to claim 7, wherein said first branching means comprise switches using PIN diodes.

60. The high-frequency amplifier according to claim 9, wherein said first branching means comprise switches using PIN diodes.

61. The high-frequency amplifier according to claim 11, wherein said first branching means comprise switches using PIN diodes.

62. The high-frequency amplifier according to claim 3, wherein said second branching means comprise switches using PIN diodes.

63. The high-frequency amplifier according to claim 5, wherein said second branching means comprise switches using PIN diodes.

64. The high-frequency amplifier according to claim 6, wherein said second branching means comprise switches using PIN diodes.

65. The high-frequency amplifier according to claim 7, wherein said second branching means comprise switches using PIN diodes.

66. The high-frequency amplifier according to claim 8, wherein said second branching means comprise switches using PIN diodes.

67. The high-frequency amplifier according to claim 10, wherein said second branching means comprise switches using PIN diodes.

68. The high-frequency amplifier according to claim 12, wherein said second branching means comprise switches using PIN diodes.

69. The high-frequency amplifier according to any of claim 22, further comprising a switch that is provided between the output terminal corresponding to the frequency band and the ground through a transmission line having the same characteristic impedance as the load impedance, wherein said transmission line has a length which is determined such that an impedance, when the load side is viewed from an output terminal of said first amplifying means, establishes a short-circuit condition in the frequency band when said switch is turned on to connect to the ground.

70. The high-frequency amplifier according to any of claim 23, further comprising a switch that is provided between the output terminal corresponding to the frequency band and the ground through a transmission line having the same characteristic impedance as the load impedance, wherein said transmission line has a length which is determined such that an impedance, when the load side is viewed from an output terminal of said first amplifying means, establishes a short-circuit condition in the frequency band when said switch is turned on to connect to the ground.

71. The high-frequency amplifier according to any of claim 24, further comprising a switch that is provided between the output terminal corresponding to the frequency band and the ground through a transmission line having the same characteristic impedance as the load impedance, wherein said transmission line has a length which is determined such that an impedance, when the load side is viewed from an output terminal of said first amplifying means, establishes a short-circuit condition in the frequency band when said switch is turned on to connect to the ground.

* * * * *